US006153510A

United States Patent [19]
Ishibashi

[11] Patent Number: 6,153,510
[45] Date of Patent: Nov. 28, 2000

[54] SEMICONDUCTOR DEVICE AND METHOD FOR MANUFACTURING THE SAME, AND SEMICONDUCTOR MEMORY DEVICE AND METHOD FOR MANUFACTURING THE SAME

[75] Inventor: Yutaka Ishibashi, Kawasaski, Japan

[73] Assignee: Kabushiki Kaisha Toshiba, Kawasaki, Japan

[21] Appl. No.: 09/383,189

[22] Filed: Aug. 26, 1999

Related U.S. Application Data

[62] Division of application No. 09/022,391, Feb. 12, 1998, Pat. No. 5,973,348.

[30] Foreign Application Priority Data

Feb. 27, 1997 [JP] Japan .................................. 9-044247

[51] Int. Cl.⁷ .............................................. H01L 21/4763
[52] U.S. Cl. ........................ 438/622; 438/618; 438/637; 438/672; 438/396
[58] Field of Search ................................ 438/618, 620, 438/622, 629, 637, 639, 672, 675, 253, 244, 387, 396, 398

[56] References Cited

U.S. PATENT DOCUMENTS

| | | | |
|---|---|---|---|
| 5,444,013 | 8/1995 | Akram et al. ........................ | 438/398 |
| 5,497,017 | 3/1996 | Gonzales ................................ | 257/306 |
| 5,569,948 | 10/1996 | Kim ...................................... | 257/382 |
| 5,616,934 | 4/1997 | Dennison et al. ...................... | 257/67 |
| 5,619,072 | 4/1997 | Mehta ................................... | 257/774 |
| 5,625,232 | 4/1997 | Numata et al. ........................ | 257/758 |
| 5,723,910 | 3/1998 | Kariyazono et al. .................. | 257/776 |
| 5,907,788 | 5/1999 | Kasai .................................... | 438/622 |
| 5,935,868 | 8/1999 | Fang et al. ............................. | 438/692 |

FOREIGN PATENT DOCUMENTS

| | | |
|---|---|---|
| 8-139293 | 5/1996 | Japan . |
| 10242423 | 9/1998 | Japan . |

*Primary Examiner*—Carl Whitehead, Jr.
*Assistant Examiner*—Jamie L. Davis
*Attorney, Agent, or Firm*—Banner & Witcoff, Ltd.

[57] ABSTRACT

In a semiconductor device constituted using a borderless contact technique, for example, when a wiring layer with a damascene structure is connected to its underlying contact portion, a trench connect g with the contact portion is formed in the second interlayer insulation film. After that, the contact portion protruded from the bottom of the trench is selectively etched to flatten the bottom of the trench to remove a very small recess from that bottom of the trench which corresponds to a contact face between the contact portion and wiring layer. Thus, both a barrier metal layer and a metal layer for forming the wiring layer can be formed in the trench with higher reliability and accordingly the wiring layer and contact portion can be brought into reliable contact with each other. In a DRAM using a simple stacked capacitor, the storage electrode and plug portion can be put into reliable contact with each other.

6 Claims, 20 Drawing Sheets

SEMICONDUCTOR DEVICE AND METHOD FOR MANUFACTURING THE SAME, AND SEMICONDUCTOR MEMORY DEVICE AND METHOD FOR MANUFACTURING THE SAME

This is a divisional of 09/022,391 filed Feb. 12, 1998, now U.S. Pat. No. 5,973,348.

BACKGROUND OF THE INVENTION

The present invention relates to a semiconductor device and a method for manufacturing the same and a semiconductor memory device and a method for manufacturing the same and, more specifically, to a DRAM (dynamic random access memory) including a semiconductor device having a wiring structure adopting a borderless contact technique and a stacked capacitor.

Semiconductor devices have recently been miniaturized in accordance with progress in semiconductor process technique and dramatically improved in degree of integration.

In a prior art semiconductor device having a structure of connecting wiring layers through a contact via, the wiring layers are increased in width at the contact portion since there are variations in pattern alignment in the lithographic process, measurements, and etching depths of contact holes. The increase in width of the wiring layers necessitates a margin for alignment, which makes the chip area larger and hinders the device from being miniaturized. Therefore, a borderless contact technique not requiring the alignment margin, has recently been used widely in which an interlayer insulation film between upper and lower wirings is flattened completely using a polishing technique such as CMP (chemical mechanical polishing) to uniform an amount of etching of the insulation film.

FIG. 1 is a cross-sectional view illustrating the major part of a typical prior art semiconductor device constituted by the borderless contact technique described above.

In the prior art semiconductor device, for example, an element isolation insulation film 102, which is a silicon oxide film, is selectively buried in a surface portion of a p-type silicon substrate 101 to form an element isolation region 101a. In this region 101a, a gate electrode 103A is provided on the silicon substrate 101. In an element region 101b other than the region 101a, a gate electrode 103B is formed on the substrate 101 with a gate oxide film 104 interposed therebetween. The gate electrodes 103A and 103B each have a layered structure of polysilicon 103a and tungsten silicide 103b. An on-gate insulation film 105, which is a silicon nitride film, is formed on the upper surface of each of the gate electrodes 103a and 103b, and a gate side-wall insulation film 106, which is also a silicon nitride film, is formed on the side-wall thereof.

Furthermore, shallow n-type diffusion layers 107a and 107b serving as source and drain regions, are formed in the surface portion of the silicon substrate 101 in the element region 101b, using the gate electrode 103B as a mask.

A plug portion 109A connecting with the gate electrode 103A and a contact portion 109B connecting with one of the diffusion layers 107a and 107b are provided in a first interlayer insulation film 108 formed all over the surface of the substrate 101 including the surfaces of the gate electrodes 103A and 103B. Each of the portions 109A and 109B is so constituted that a contact hole 108a is formed in the first interlayer insulation film 108, a barrier metal layer 109a of Ti/TiN is formed at least on the bottom and side of the hole 108a, and a metal layer 109b of tungsten or aluminum is formed on the layer 109a.

A second interlayer insulation film 110 is formed all over the surface of the first interlayer insulation film 108, including the surfaces of the plug portion 109A and contact portion 109B, and both a plug portion 111A connecting with the plug portion 109A and a wiring layer 111B connecting with the contact portion 109B are formed on the film 110. Each of the plug portion 111A and wiring layer 111B is so constituted that both a contact hole 110a and a trench 110b are formed in the second interlayer insulation film 110, a barrier metal layer 111a of Ti/TiN is formed on at least the bottom and side of each of the hole 110a and trench 110b, and a metal layer 111b of tungsten or aluminum is formed on the layer 111a.

In the semiconductor device so constituted, for example, when the second interlayer insulation film 110 is processed selectively by RIE (reactive ion etching) to form the above contact hole 110a and trench 110b, an amount of etching for the RIE is set larger in consideration of variations in pattern alignment in the lithographic process, measurements, thickness of the second interlayer insulation film 110, etc. For this reason, when the film 110 is processed, that part of the first interlayer insulation film 108 which contacts the plug and contact portions 109A and 109B, is over-etched to obtain recesses. 112a and 112b. Usually these recesses have various measurements since they are influenced complexly and randomly by the above-described variations.

The recess 112b having a large area may not cause a serious problem, whereas the recess 112a having a very small area has a drawback in which the barrier metal layer 111a and metal layer 111b are formed incompletely to cause a void, and a conductive film cannot be covered sufficiently. The drawback will be disadvantageous to suppressing an increase in contact resistance, a variation, and a decrease in wiring reliability. Further, the drawback is not limited to the formation of the plug portion 111A and wiring layer 111B, but is true of the formation of the contact via for connecting the upper and lower wiring layers and that of a storage electrode in a DRAM using a stacked capacitor.

For example, in the layout of cells of the DRAM, the borderless contact technique has been employed in order to reduce the chip area. Even though the area per bit is decreased in accordance with miniaturization of the DRAM, several tens of femto-farads (fF) of the storage capacitance of the capacitor have to be secured. For this reason, a three-dimensional structure such as a stacked structure and a trenched structure, is adopted in the capacitor of the DRAM which is progressing in miniaturization.

It is considered to employ not only a silicon oxide film and a silicon nitride film, but also a high dielectric thin film, such as tantalum pentaoxide ($Ta_2O_5$), strontium titanic acid ($SrTiO_3$(STO)), strontium barium titanic acid (($Ba, Sr$) $TiO_3$ (BSTO)), as the capacitor insulation film.

In order to apply the high dielectric thin film to a highly-integrated semiconductor device appearing after a 1-Gbit DRAM, in which the high dielectric thin film is formed by the minimum processing measurements of 0.2$\mu$m or less, the thin film has to be formed uniformly and at high grade on a storage electrode. Thus, the advantage of the storage electrode, to which a complicated processing of forming a fin type storage electrode and making the surface of the electrode coarse is applied, will be lost. The high dielectric thin film is thin in comparison with the oxide film, but its actual thickness is relatively large, which will not take effect too much.

In particular, when the storage electrode has a complicated shape, the leak current of the capacitor increases, the breakdown voltage thereof lowers, and the reliability thereof deteriorates. It is thus desirable to form a storage electrode having a simple shape when a high dielectric thin film is employed in the capacitor insulation film.

FIG. 2 is a cross-sectional view illustrating the structure of a prior art DRAM cell using a simple, stacked capacitor.

For example, an element isolation trench portion 202 is formed selectively in a surface portion of an p-type silicon substrate 201, and n-type diffusion layers 204 serving as source and drain regions are formed therein using a gate electrode 203 as a mask, thus obtaining a plurality of MOS transistors. The gate electrode 203 is constituted of polysilicon and tungsten silicide and formed on the silicon substrate 201, with a gate oxide film 205 interposed therebetween. The top and side of the gate electrode 203 are covered with an insulation film 206.

A bit line 207 formed of both polysilicon and tungsten is connected to one of the diffusion layers 204 of the source and drain regions. An interlayer insulation film 208 is formed on the entire surface of the substrate 201 including the surface of the bit line 207, and a plug portion 209 connecting with the other diffusion layer 204, is provided in the interlayer insulation film 208. Furthermore, an interlayer insulation film 301 is deposited on the layer 208 to form a storage electrode 210 connecting with the plug portion 209 and provide a plate electrode 212 with a capacitor insulation film 211 interposed therebetween. In this case, if an Ru film is used as-both the storage electrode 210 and plate electrode 212 and a BSTO film is employed as the capacitor insulation film 211, the structure of a stacked capacitor can be simplified.

To form the interlayer insulation film 301 on the interlayer insulation film 208 prevents the plug portion 209 from being exposed after the storage electrode 210 is formed, the exposure of the plug portion 209 being caused due to variations in pattern alignment in the lithographic process and in measurements, when the short side of the storage electrode 210 is almost equal to the width of the plug portion 209. In other words, if the BSTO film is formed with the plug portion 209 exposed from the surface, a capacitor is to be formed between the storage electrode 210 and plug portion 209 the matter of which differs from that of the storage electrode 210. This capacitor increases in leak current, decreases in breakdown voltage, and degrades in reliability.

In order to prevent a capacitor from being formed between the capacitor insulation film 211 and plug portion 209, the interlayer insulation film 301 is deposited further on the interlayer insulation film 208 including the surface of the plug portion 209, a trench 302 is formed in that area of the film 301 where the capacitor is to be formed, and the storage electrode 210 is formed in the trench 302 and connected to the plug portion 209 at the bottom of the trench 302.

However, the capacitor having the above constitution has to be formed by setting the short side of each of the plug portion 209 and trench 302 to the minimum. Due to both a variation in pattern alignment in the lithographic process and over-etching in the region where the capacitor is to be formed, not only the interlayer insulation film 301 on the plug portion 209, but also part of the interlayer insulation film 208 is etched to excess, and a recess 303 is formed alongside the plug portion 209. The recess 303 varies in size and aspect ratio because of variations in pattern alignment and an amount of over-etching.

If, in particular, the recess 303 is very small, the storage electrode 210 is formed incompletely therein; therefore, neither the capacitor insulation film 211 nor the plate electrode 212 formed on the storage electrode 210 is sufficiently covered with an Ru film. Such a capacitor increases in leak current and thus decreases in reliability.

BRIEF SUMMARY OF THE INVENTION

The prior art semiconductor device is miniaturized and integrated by adopting a borderless contact technique which requires no margin for pattern alignment in the lithographic process. As described above, however, it has the following drawback. When a contact hole or a trench is formed in a second insulation film between first and second conductive layers to connect with the first conductive layer, the second insulation film is inevitably over-etched in view of variations in thickness and amount of etching even though the underlying first insulation film is flattened. The first insulation film is also etched by the over-etch of the second insulation film, and a recess corresponding to a variation in pattern alignment and an amount of the over-etch is formed near the first conductive layer.

Due to the variation in pattern alignment within a fixed range of specifications, recesses of different sizes will be formed. If, in particular, a very small recess is formed, the second conductive layer is formed incompletely in the recess when it is to be formed in the contact hole or trench, and the contact resistance is increased, thus hindering a reliable contact between the first and second conductive layers and decreasing in reliability of the device.

Accordingly, a first object of the present invention is to provide a semiconductor device capable of bringing first and second conductive layers into reliable contact with each other to prevent a decrease in reliability due to poor contact, and a method for manufacturing the same.

A second object of the present invention is to provide a semiconductor memory device capable of bringing-plug and storage electrodes into reliable contact with each other to prevent a decrease in reliability due to poor contact, and a method for manufacturing the same.

In the semiconductor device and the method for manufacturing the same, the contact hole or trench, which is formed in the second insulation film on the first conductive layer and connected to the first conductive layer, can sufficiently be covered with the second conductive layer to bring the first and second conductive layers into reliable contact with each other.

In the semiconductor memory device and the method for manufacturing the same, the capacitor insulation film and plate electrode can sufficiently be covered with the storage electrode which is formed in the contact hole or trench formed in the interlayer insulation film on the plug electrode and connected to the plug electrode to bring the plug and storage electrodes into reliable contact with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will now be described with reference to the accompanying drawings.
(First Embodiment)

Figure 1:
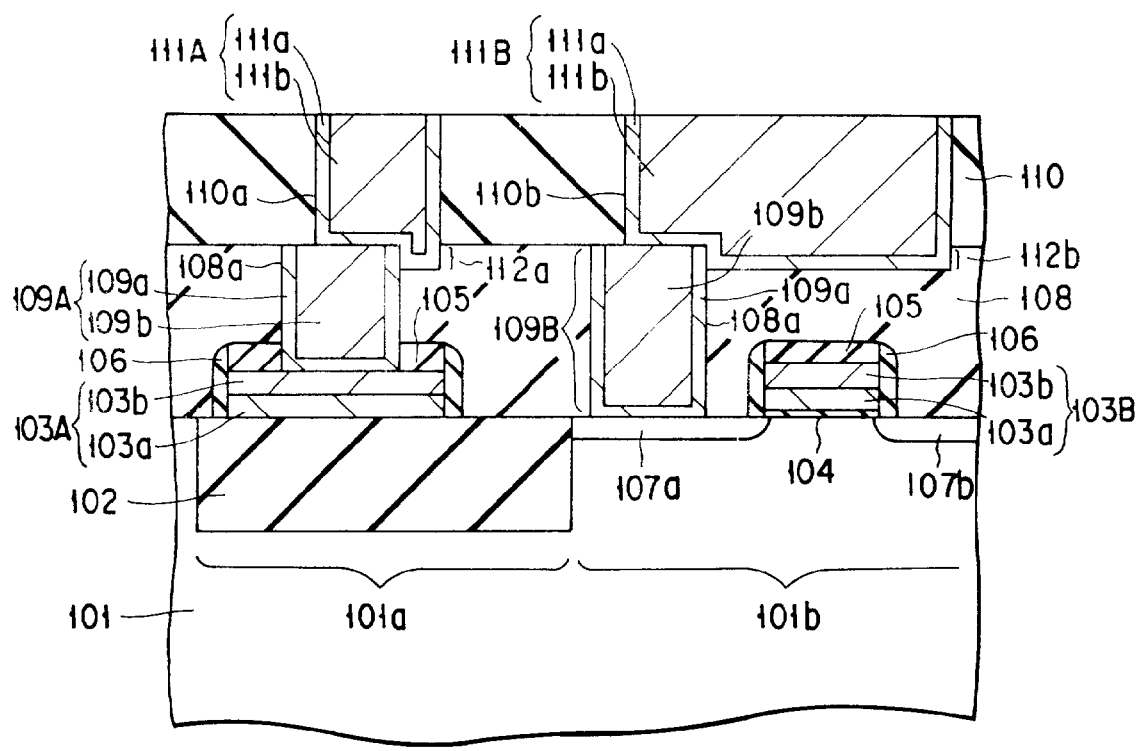
FIG. 1 is a cross-sectional view showing the major part of a prior art, typical semiconductor device formed using a borderless contact technique.
Figure 2:
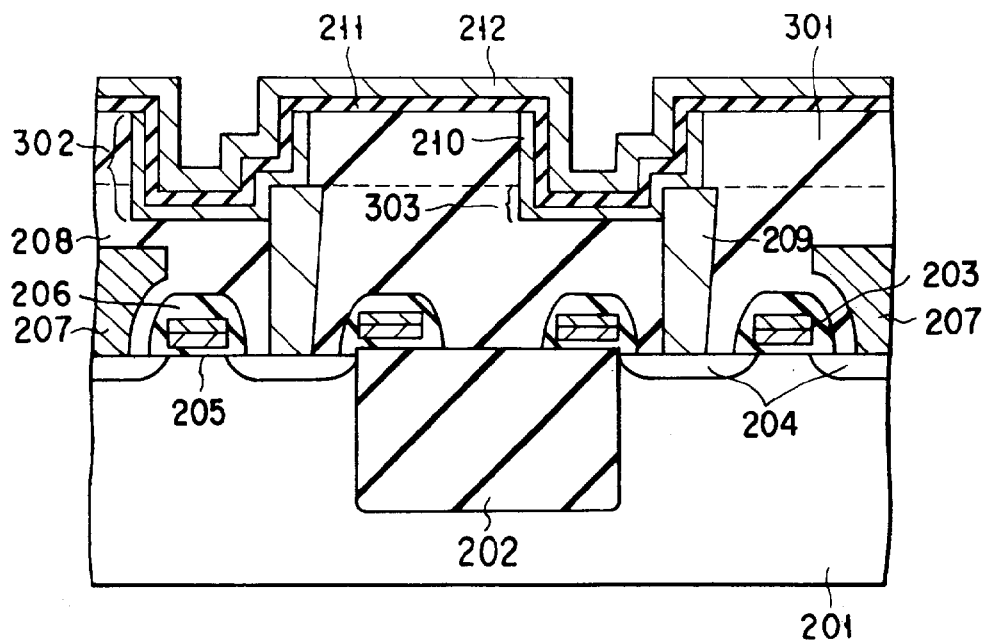
FIG. 2 is a cross-sectional view illustrating a cell structure of a DRAM using a simple, stacked capacitor.
Figure 3:
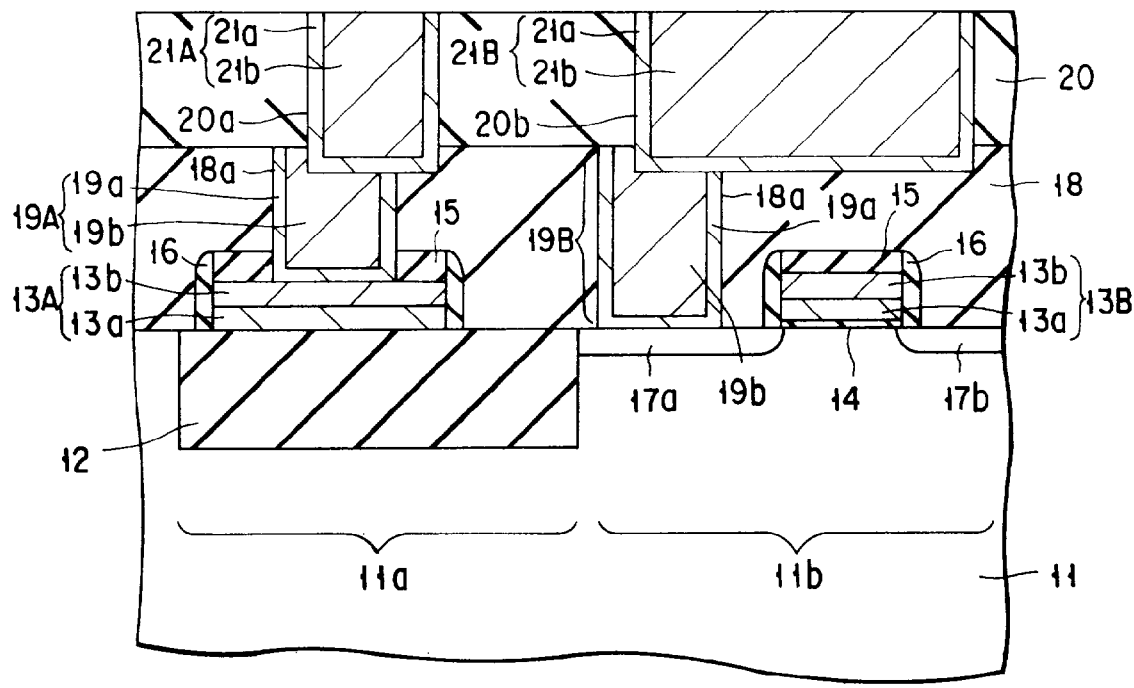
FIG. 3 is a cross-sectional view illustrating the major part of a semiconductor device according to a first embodiment of the present invention.

FIG. 3 illustrates the major part of a semiconductor device according to the first embodiment of the present invention.

For example, an element isolation insulation film 12, which is formed of a silicon oxide film, is selectively buried in a surface portion of a p-type silicon substrate 11 to form an element isolation region 11a. A gate electrode 13A is provided on the silicon substrate 11 in the element isolation region 11a, whereas a gate electrode 13B is formed on the substrate 11 in an element region 11b other than the region 11a, with a gate insulation film 14 interposed between the substrate 11 and gate electrode 13B.

The gate electrodes 13A and 13B each have a layered structure of polysilicon 13a and tungsten silicide 13b. An on-gate insulation film 15 is formed of a silicon nitride film on the upper surface of each of the gate electrodes 13a and 13b, and a gate side-wall insulation film 16 is formed of a silicon nitride film on the side-wall thereof.

Furthermore, shallow n-type diffusion layers 17a and 17b serving as source and drain regions, are formed in the surface portion of the silicon substrate 11 in the element region 11b, using the gate electrode 13B as a mask.

A plug portion 19A connected to the gate electrode 13A as a first conductive layer and a contact portion 19B connected to one of the diffusion layers 17a and 17b are provided in a first interlayer insulation film 18 formed all over the surface of the substrate 11 including the gate electrodes 13A and 13B. In each of the plug and contact portions 19A and 19B, a metal layer 19b of tungsten or aluminum is formed on at least the bottom and side of a contact hole 18a in the first interlayer insulation film 18, with a barrier metal layer 19a of Ti/TiN interposed therebetween.

A plug portion 21A connected to the plug portion 19A and a wiring layer 21B connected to the contact portion 19B are provided in a second interlayer insulation film 20 formed all over the surface of the first interlayer insulation film 18 including the plug portion 19A and contact portion 19B. In each of the plug portion 21A and wiring layer 21B, a metal layer 21b of tungsten or aluminum is formed on at least the bottom and side of each of a contact hole 20a and a trench 20b in the second interlayer insulation film 20, with a barrier metal layer 21a of Ti/TiN interposed therebetween.

The plug portion 21A and wiring layer 21B each have an almost flat bottom to make good contact between the plug portions 19A and 21A and between the plug portions 19B and 21B. More specifically, since the contact hole 20a and trench 20b are formed such that their bottoms are almost flat, a very small recess is prevented from being formed in each contact portion, thereby more reliably forming the plug portion 21A to be connected to the plug portion 19A and the wiring layer 21B to be connected to the contact portion 19B.

Referring to FIGS. 4A to 4F, a method for manufacturing the above semiconductor device will be described.

First a silicon oxide film 31 is formed on the entire surface of a p-type silicon substrate 11 by, e.g., thermal oxidation and then a silicon nitride film 32 is formed thereon by LPCVD. The films 31 and 32 are patterned by a known lithographic technique and partly removed from the silicon substrate 11 by RIE. To form an element isolation region 11a, a trench 33 is formed in a surface region of the substrate 11.

A resist (not shown) for the above patterning is eliminated and a silicon oxide film is deposited on the entire surface of the resultant structure by LPCVD or plasma CVD. The silicon oxide film is flattened by CMP using the silicon nitride film 32 as an etching stopper to form an element isolation insulation film 12 only in the trench 33 (see FIG. 4A).

The silicon nitride film 32 is separated from the structure by a heated solution of phosphoric acid, and the silicon oxide film 31 remaining on an element region 11b is etched using a solution of ammonium fluoride. At the same time, the surface of the element isolation insulation film 12 buried in the trench 33 is removed so as to be almost flush with the upper surface of the silicon substrate 11 (see FIG. 4B).

After that, a gate oxide film 14 is formed on the element region 11b by thermal oxidation, phosphorus-doped polysilicon 13a is formed on both the gate oxide film 14 and the element isolation insulation film 12 by LPCVD, a tungsten silicide 13b is formed thereon by sputtering or CVD, and a silicon nitride film is formed thereon by LPCVD. The resultant structure is patterned by the lithographic technique and etched by RIE to form gate electrodes 13A and 13B and an on-gate insulation film 15. After a resist (not shown) for the patterning is eliminated, arsenic or phosphorus is implanted using the gate electrode 13B as a mask to form source and drain regions, and diffusion layers 17a and 17b are formed in the surface region of the silicon substrate 11. Further, a silicon nitride film is deposited on the whole surface of silicon substrate 11 including the gate electrodes 13A and 13B and etched excluding its side-walls thereby to form a gate side-wall insulation film 16 on each side-wall portion of the gate electrodes 13A and 13B (see FIG. 4C).

Subsequently, a BPSG film is deposited on the whole surface of the silicon substrate 11 including the surfaces of the gate electrodes 13A and 13B by, e.g., LPCVD, thereby to form a first interlayer insulation film 18. The upper surface of the film 18 is flattened by CMP or the like, and both a contact hole 18a for forming a plug portion 19A connecting with the gate electrode 13A and another contact hole 18a for forming a contact portion 19B connecting with one of the diffusion layers 17a and 17b are formed by the lithographic technique and RIE using $CHF_3$ and CO or $C_4F_8$ and CO and Ar as etching gas. A barrier metal layer 19a of Ti/TiN is formed by sputtering on at least the bottom and side of each of the contact holes 18a, and then a metal layer 19b of tungsten or aluminum having an adequate thickness is formed on the entire surface of the resultant structure by blanket CVD or the like. The metal layers 19a and 19b are removed by CMP so as to remain only in the holes 18a to form the plug portion 19A and contact portion 19B (see FIG. 4D).

A second interlayer insulation film 20, which is constituted of a silicon oxide film, is formed by LPCVD or plasma CVD on the entire surface of the first interlayer insulation film 18 including those of the plug portion 19A and contact portion 19B. Both a contact hole 20a for forming a plug portion 21A connecting with the plug portion 19A and a trench 20b for forming a wiring layer 21B connecting with the contact portion 19B are formed in the second interlayer insulation film 20 (see FIG. 4E).

The above contact hole 20a and trench 20b are formed by RIE using $CHF_3$ and CO or $C_4F_8$ and CO and Ar as etching gas, using a resist (not shown) for patterning in the known lithographic process as a mask. In this etching condition, the etching rate of insulative materials such as a silicon oxide film used in the second interlayer insulation film 20 is higher than that of Ti/TiN and tungsten or aluminum used in the plug portion 19A and contact portion 19B, thereby achieving an adequate selection ratio.

Figure 4A:
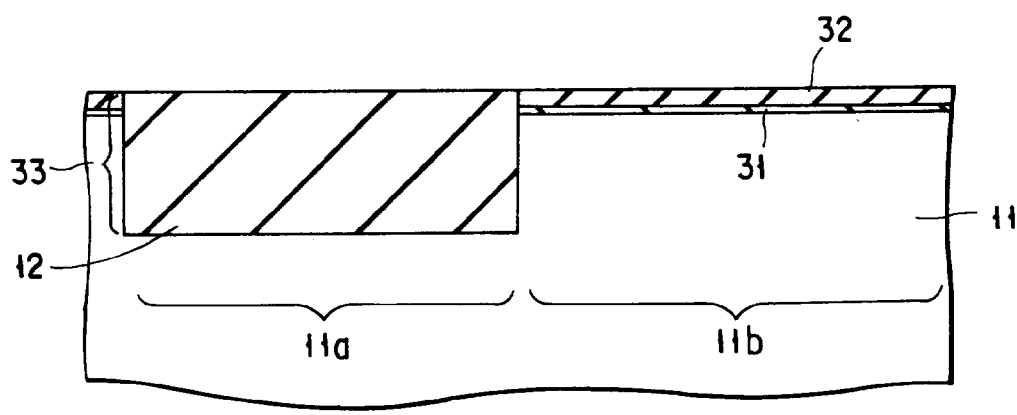
FIGS. 4A to 4F are cross-sectional view showing the major part of the semiconductor device of FIG. 3 in order to explain a method for manufacturing the same.
Figure 4B:
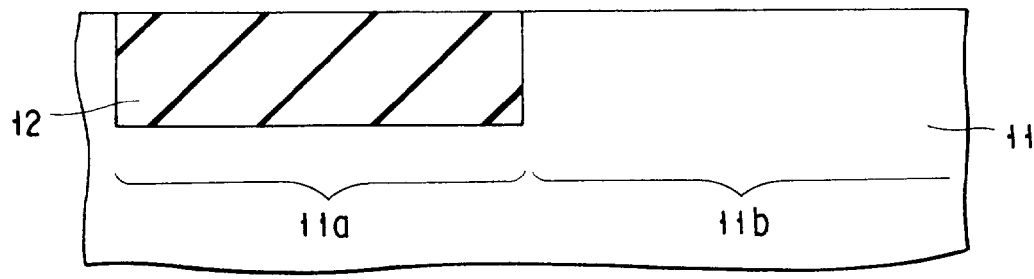
Figure 4C:
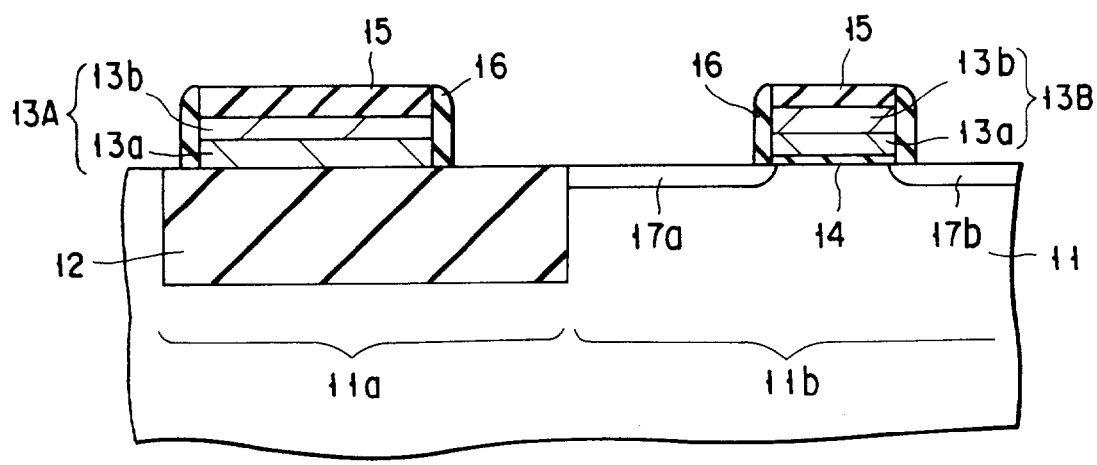
Figure 4D:
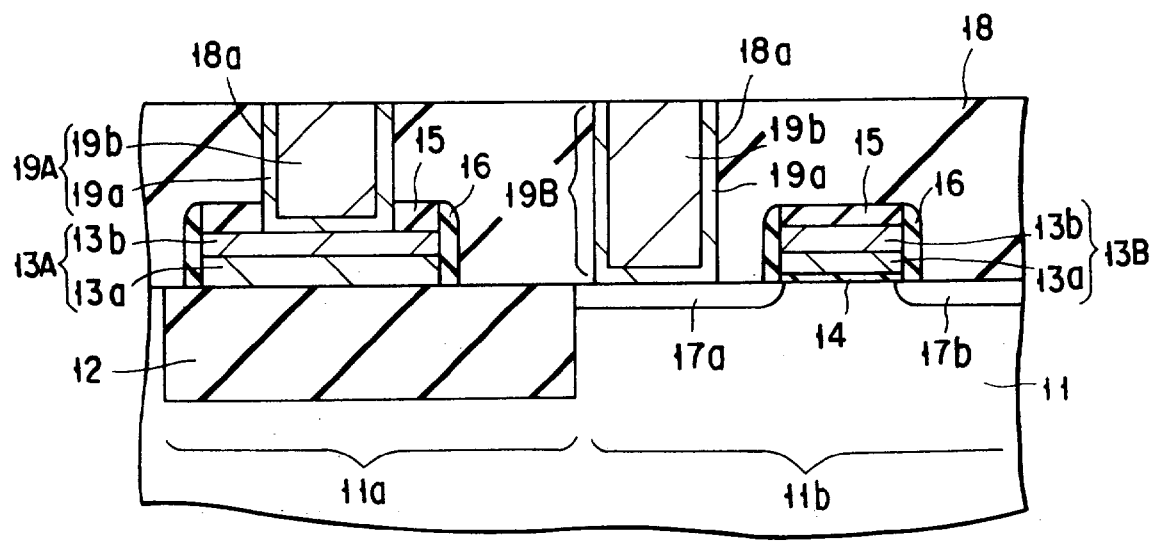
Figure 4E:
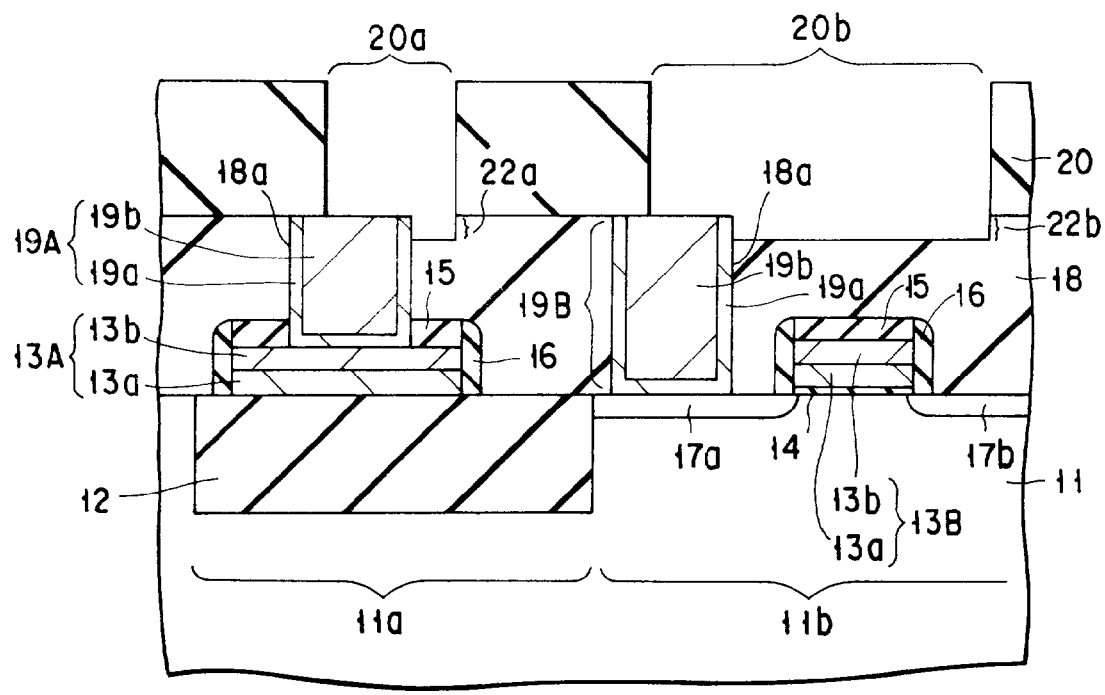
Figure 4F:
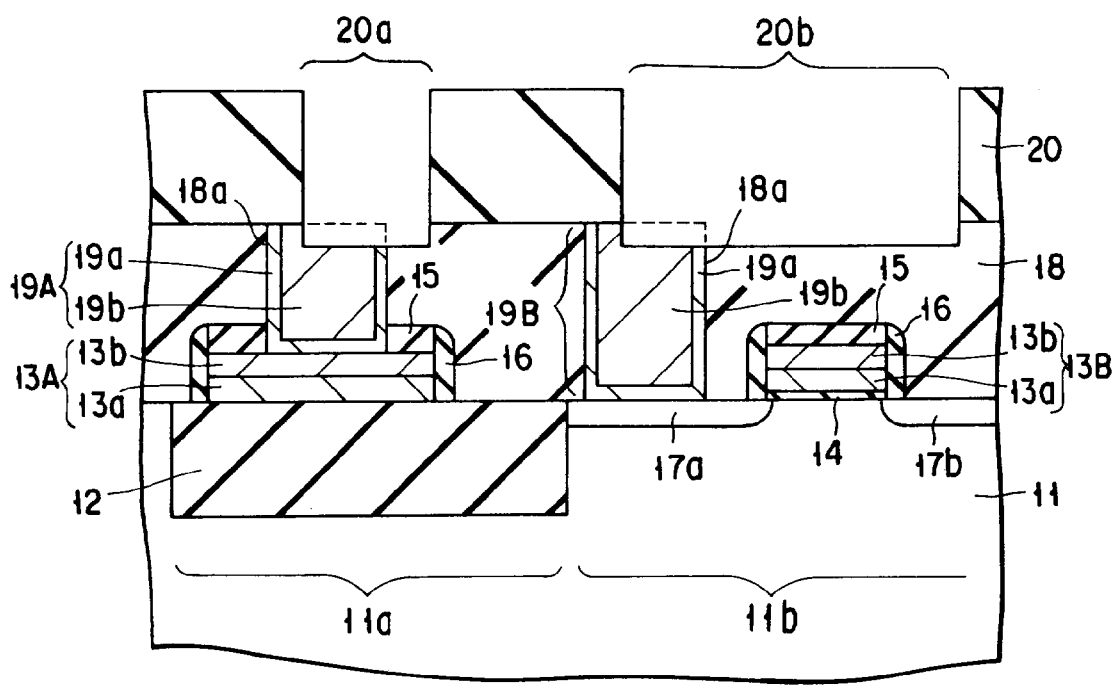

The second insulation film is slightly over-etched in view of variations in thickness and etching uniformity of the second insulation film when the contact hole 20a and trench 20b are formed by RIE. Due to a shift in pattern alignment in the lithographic process, not only the second interlayer insulation film 20 on the plug portion 19A and contact portion 19B, but also its underlying first interlayer insulation film 18 is partly etched by the over-etching of the second interlayer insulation film 20 in accordance with an amount of the shift in pattern. Consequently, as illustrated in FIG. 4E, the plug portion 19A and contact portion 19B partly remain on the bottoms of the contact hole 20a and trench 20b, thus forming both a recess 22a corresponding to a difference between the top of the remaining plug portion 19A and the deepest portion of the contact hole 20a and a recess 22b corresponding to a difference between the top of the remaining contact portion 19B and the deepest portion of the trench 20b.

The recesses 22a and 22b make it difficult to form contacts (plug portion 21A and wiring layer 21B) in the contact hole 20a and trench 20b. Therefore, the plug portion 19A and contact portion 19B remaining on the bottoms of the contact hole 20a and trench 20b are removed (portions indicated by the broken lines in FIG. 4F) such that the bottoms are almost flattened and, in other words, the recesses 22a and 22b are removed (see FIG. 4F).

In the manufacturing method described above, gas whose etching selection ratio is opposite to that of etching gas of $CHF_3$ and CO, for example, gas whose etching speed is low in the second insulation film 20 and high in both the plug portion 19A and contact portion 19B (gas of SF6 and Cl2 when the portions 19A and 19B include tungsten) is used.

The bottoms of the contact hole 20a and trench 20b need not be flattened completely, but the plug portion 19A and contact portion 19B can partly be removed to such an extent that a drawback of inadequately forming the barrier metal layer 21a will not occur when the plug portion 21A and wiring layer 21B are formed.

Finally, the barrier metal layer 21a is formed of Ti/TiN by sputtering or CVD such that its thickness sufficiently covers at least the bottoms and sides of the contact hole 20a and trench 20b, and annealed in an atmosphere of nitrogen gas. After that, a metal layer 21b of tungsten or aluminum having a sufficient thickness is formed on the entire surface of the resultant structure by blanket CVD or the like. The metal layers 21a and 21b are removed by CMP so as to leave only in the contact hole 20a and trench 20b to form the plug portion 21A and wiring layer 21B, resulting in the semiconductor device shown in FIG. 3.

The semiconductor device with the above constitution has a so-called damascene structure in which the wiring layer 21B is buried into the second interlayer insulation film 20. In this structure, the wiring layer 21B can be brought into contact with its underlying (layer) contact portion 19B with high reliability. Even when the plug portion 21A is formed to be connected to its underlying plug portion 19A, a very small recess can be prevented from being formed in the contact portion, and the barrier metal layer 21a can be formed insufficiently to cause a void, thereby resolving a drawback of increasing in contact resistance.

As described above, when both the contact hole for forming the upper plug portion connected to the lower plug portion and the trench for forming the upper wiring layer connected to the lower contact portion are formed in the second interlayer insulation film, a very small recess can be prevented from being formed in the contact portion between the lower plug portion or contact portion and the upper plug portion or wiring layer. More specifically, according to the semiconductor device wherein the plug portion or wiring layer is buried as the second (upper) layer in the contact hole or trench formed in the second interlayer insulation film, part of the plug portion and contact portion of the first layer, which is projected into the contact hole and trench, is eliminated to almost flatten the bottoms and sides of the contact hole and groove. Since, therefore, the plug portion and wiring layer of the second layer can sufficiently be formed in the contact hole and trench, their coverage can be expected. Consequently, the plug portion and contact portion of the first layer and the plug portion and wiring layer of the second layer can be brought into reliable contact with each other, thereby making it possible to prevent a decrease in reliability due to poor contact such as an increase in contact resistance and disconnection.

In the semiconductor device according to the first embodiment of the present invention, the metal layer of tungsten or aluminum is buried through the barrier metal layer of Ti/TiN as the plug and contact portions. The present invention is not limited to this structure. For example, polysilicon doped with arsenic or phosphorus can be buried. In this case, as an etching gas for flattening the bottoms of the contact hole and trench, $Cl_2$ or HBr can be used in order to etch part of the plug and contact portions formed of polysilicon.

The present invention is not limited to the use of the p-type silicon substrate. For example, an n-type silicon substrate can be used. Furthermore, the present invention is not limited to the semiconductor device of two layers in which the plug portion and wiring layer of the second layer are connected to the plug portion and contact portion of the first layer. For example, it can be applied to a semiconductor device having three or more layers.

Figure 5:
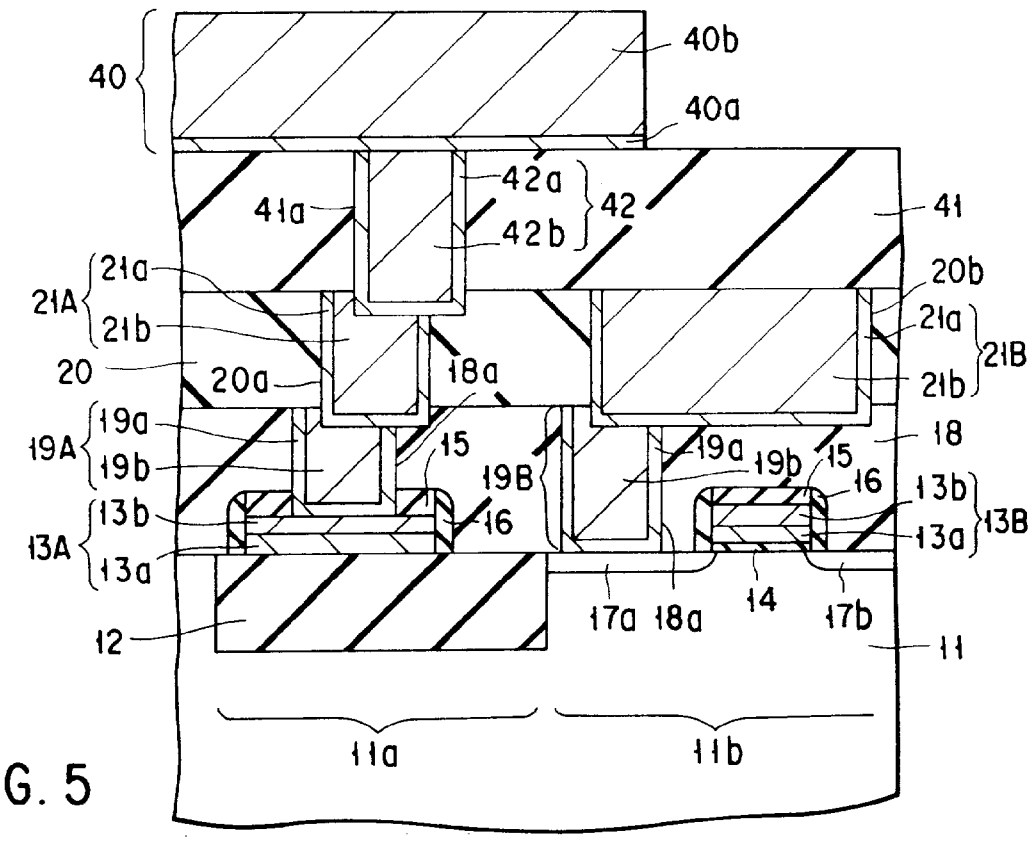
FIG. 5 is a cross-sectional view illustrating an example of the semiconductor device of FIG. 3 in which a plug portion of the second layer is connected to its upper wiring layer.

FIG. 5 is a cross-sectional view schematically showing the main part of the semiconductor device according to the first embodiment of the present invention in which the plug portion 21A of the second layer is connected to its upper wiring layer 40.

In the device of FIG. 5, a third interlayer insulation film 41 is formed on the entire surface of the second interlayer insulation film 20 including the plug portion 21A and wiring layer 21B. A contact hole 41a for forming the plug portion 42 connecting with the plug portion 21A, is formed in the third interlayer insulation film 41 by RIE.

After that, part of the plug portion 21A, which is projected into the contact hole 41a, is removed by etching, for example, on the same condition as that for flattening the bottom of the above contact hole 20a, in order to make the bottom of the contact hole 41a almost flat. Both a barrier metal layer 42a and a metal layer 42b are formed in the contact hole 41a in the same manner to form a plug portion 42 of the third layer connecting with the plug portion 21A.

Thereafter, a metal layer 40b is formed of tungsten or aluminum on the upper surface of the third interlayer insulation film 41 by blanket CVD or the like, with a barrier metal layer 40a interposed therebetween, the layer 40a being formed of Ti/TiN by sputtering or CVD. The metal layer 40b is then patterned to have a predetermined shape by the lithographic technique, resulting in a semiconductor device in which a wiring layer 40 of the fourth layer connecting with the plug portion 42. In this semiconductor device, the plug portion 42 can be brought into reliable contact with the plug portion 21A, in addition to the contact portions between the plug portions 21A and 19A and between the wiring layer 21B and contact portion 19B.

Figure 6:
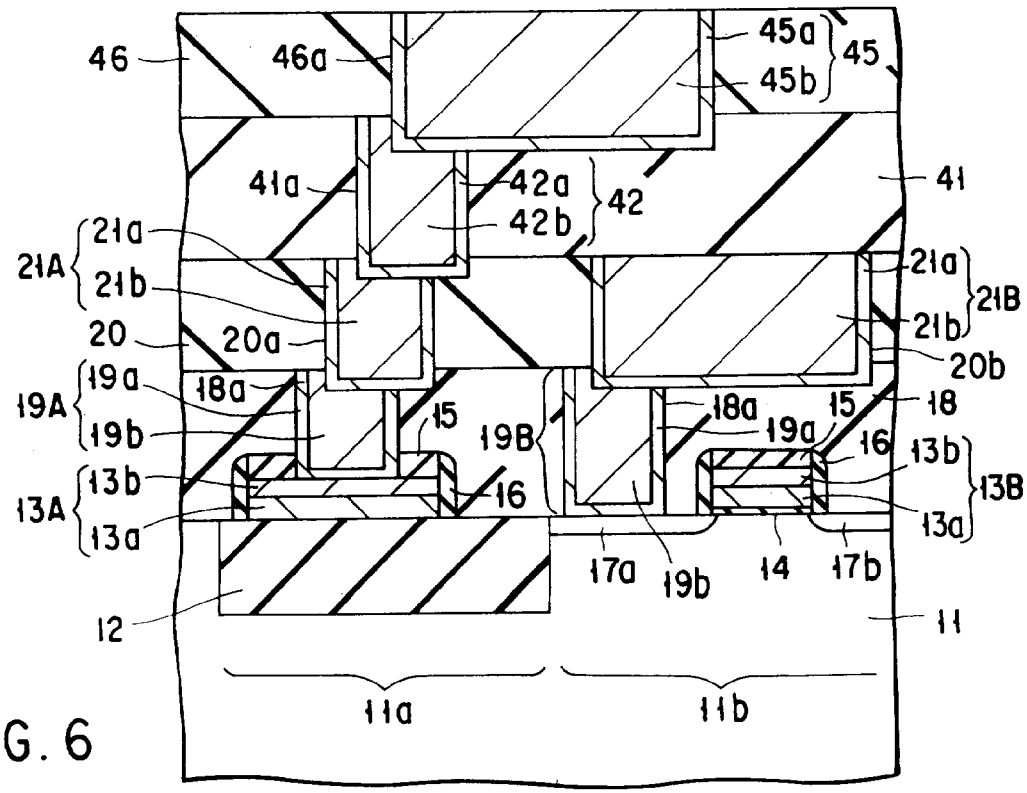
FIG. 6 is a cross-sectional view illustrating another example of the semiconductor device of FIG. 3 in which the plug portion is connected to its upper wiring layer of a damascene structure.

FIG. 6 is a cross-sectional view schematically showing the semiconductor device according to the first embodiment of the present invention in which the plug portion 21A of the second layer is connected to its upper wiring layer 45 of the damascene structure.

In the device of FIG. 6, the plug portion 42 connecting with the plug portion 21A is formed in the third interlayer insulation film 41, and a fourth interlayer insulation film 46 is formed on the entire surface of the third interlayer insulation film 41 including the plug portion 42. A trench 46a for forming a wiring layer 45 connecting with the plug portion 42, is formed in the fourth interlayer insulation film 46 by RIE.

After that, part of the above plug portion 42, which is projected into the trench 46a, is removed by etching, for example, on the same condition as that for flattening the bottom of the above contact hole 20a, in order to make the bottom of the trench 46a flat. Thereafter, both a barrier metal layer 45a and a metal layer 45b are formed in the trench 46a in the same manner to obtain a semiconductor device having the wiring layer (fourth layer) 45 of the damascene structure connecting with the plug portion 42.

According to the device with the above constitution, the wiring layer 45 can be brought into reliable contact with the plug portion 42, in addition to the contact portions between the plug portions 21A and 19A, between the wiring layer 21B and contact portion 19B, and between the plug portions 42 and 21A.

The semiconductor device is not limited to a typical semiconductor device formed using the borderless contact technique. For example, it can be applied to a DRAM having a simple stacked capacitor structure.

(Second Embodiment)

Figure 7:
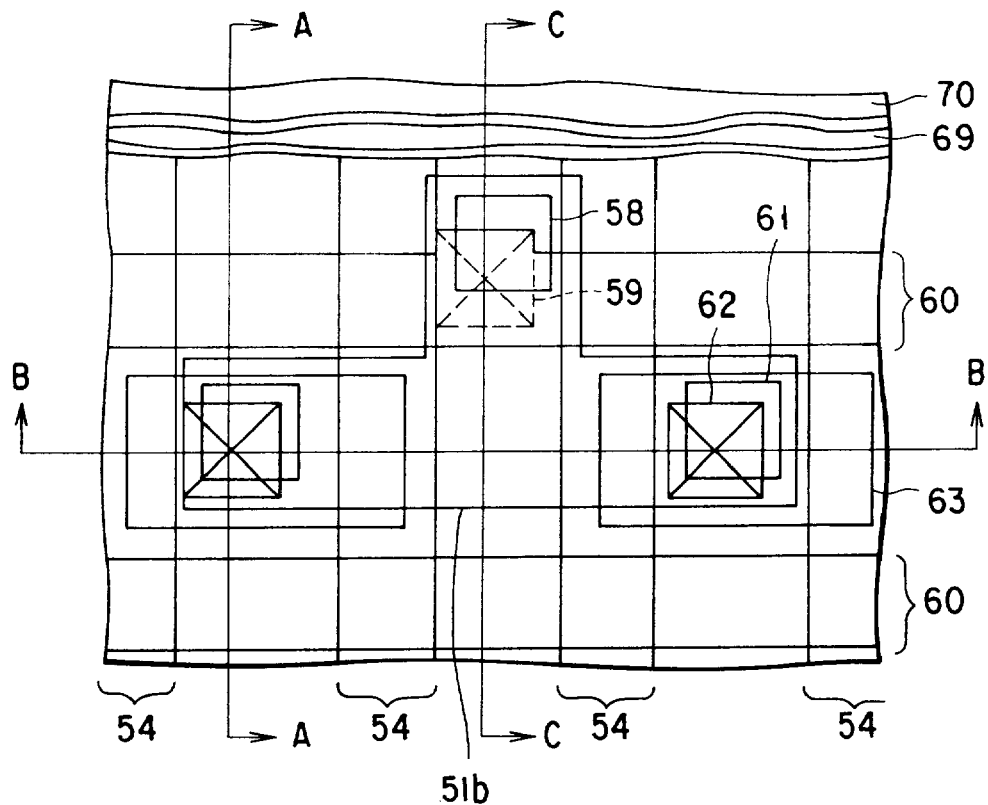
FIG. 7 is a plan view illustrating the major part of a DRAM according to a second embodiment of the present invention.
Figure 8A:
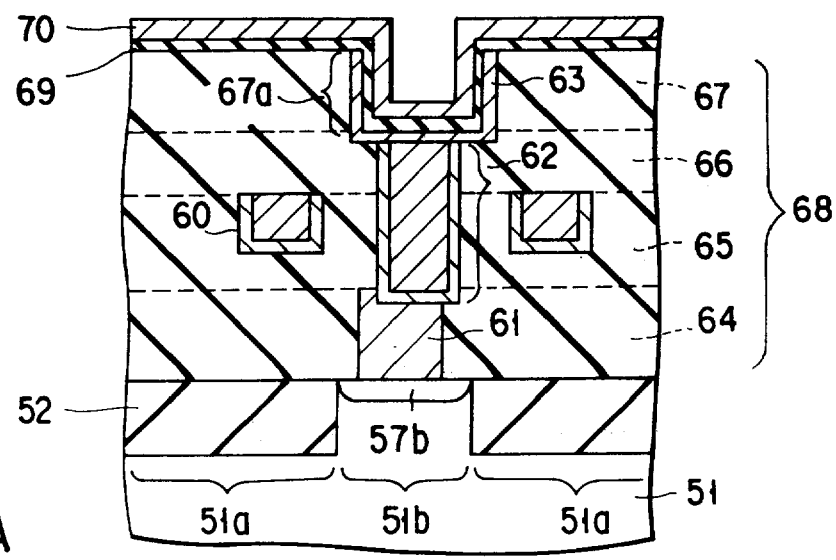
FIGS. 8A to 8C are cross-sectional view showing the major part of the DRAM of FIG. 7.
Figure 8B:
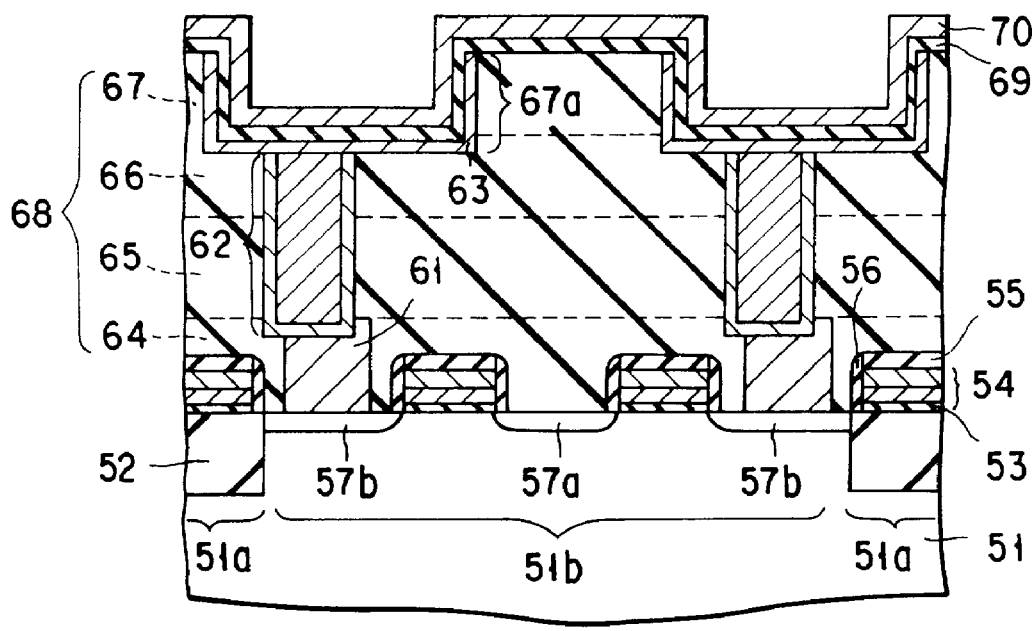
Figure 8C:
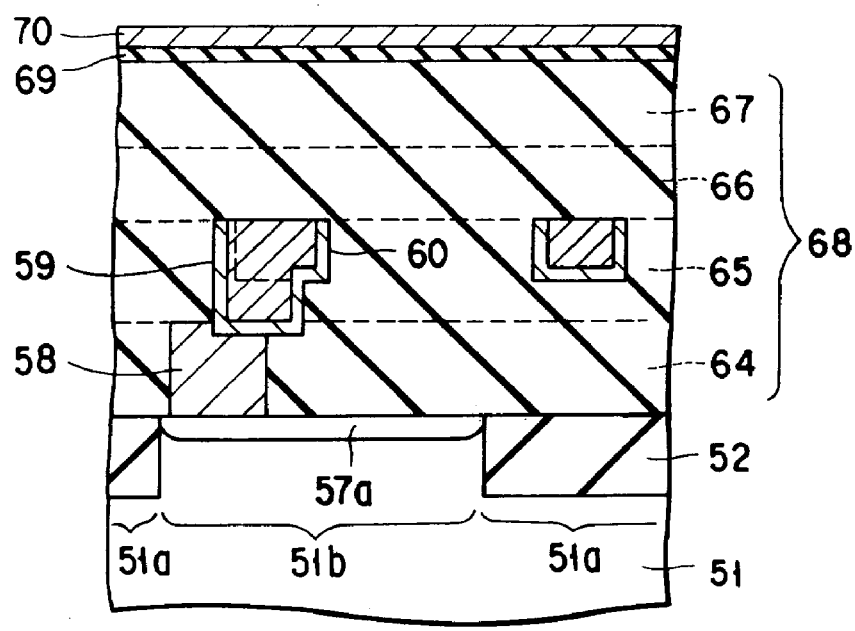

FIGS. 7 and 8A to 8C illustrate the constitution of a DRAM having a simple stacked capacitor as a semiconductor device according to a second embodiment of the present invention. FIG. 7 is a plan view of the main part of the cell structure, FIG. 8A is a cross-sectional view taken along line A—A of FIG. 7, FIG. 8B is a cross-sectional view taken along line B—B of FIG. 7, and FIG. 8C is a cross-sectional view taken along line C—C.

In the second embodiment, as illustrated in FIGS. 8A to 8C, an element isolation insulation film 52 of silicon oxide film is buried in the surface portion of a p-type silicon substrate 51 to selectively form an element isolation region 51a.

A plurality of gate electrodes (word lines) 54 are provided on the upper surface of the silicon substrate 51 in the element isolation region 51a and on that in the element region 51b, with a gate oxide film 53 interposed therebetween (see FIG. 8B).

Each of the gate electrodes 54 is constituted of polysilicon and tungsten silicide. A on-gate insulation film 55 and a gate side-wall insulation film 56, each of which is constituted of silicon nitride, are provided on the upper surface and the side of each gate electrode 54, respectively. In the element region 51b, n-type diffusion layers 57a and 57b serving as source and drain regions are formed on the surface of the silicon substrate 51 using the gate electrodes as masks, thereby to form a plurality of MOS transistors. A contact portion 58 of polysilicon is connected to one 57a of the diffusion layers, and a bit line 60 of Ti/TiN and tungsten is connected to the contact portion 58 through a plug portion 59 (see FIG. 8C).

A storage electrode 63 of the capacitor is connected to the other diffusion layer 57b through a contact portion 61 of polysilicon and a plug portion 62 of Ti/TiN and tungsten (see FIGS. 8A and 8B).

The storage electrode 63 is provided along the side and bottom of a trench 67a formed in that region of an interlayer insulation film 68 of first to fourth silicon oxide films 64 to 67 where the capacitor is to be formed, and connected to the plug portion 62 at its bottom. A plate electrode 70 is then provided on the entire surface of the interlayer insulation film 68 including the storage electrode 63 with a capacitor insulation film 69 interposed therebetween (see FIGS. 8A to 8C).

The plug portions 59 and 62 and storage electrode 63 each have a bottom almost flat thereby to satisfy contact between the plug portion 59 and contact portion 58, between the plug portion 62 and contact portion 61, and between the storage electrode 63 and plug portion 62.

Figure 9A:
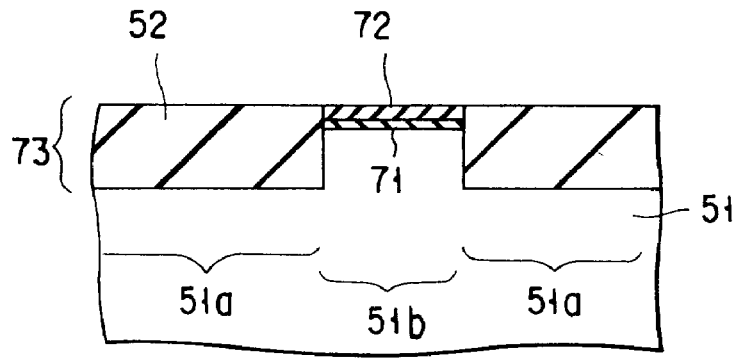
FIGS. 9A to 9C are cross-sectional view showing the major part of the DRAM of FIG. 7 in order to explain a method for manufacturing the same.
Figure 9B:
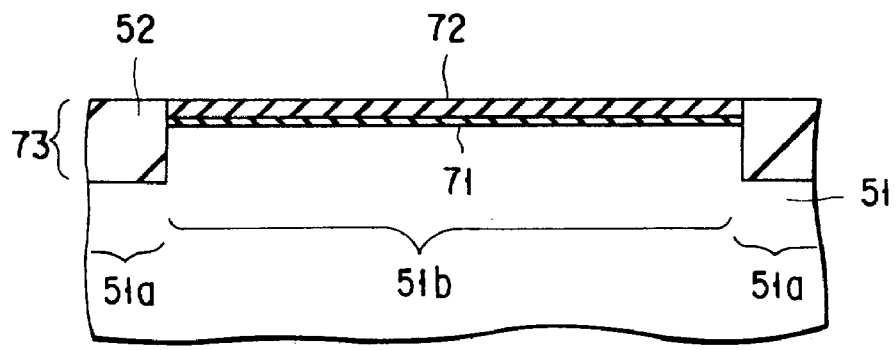
Figure 9C:
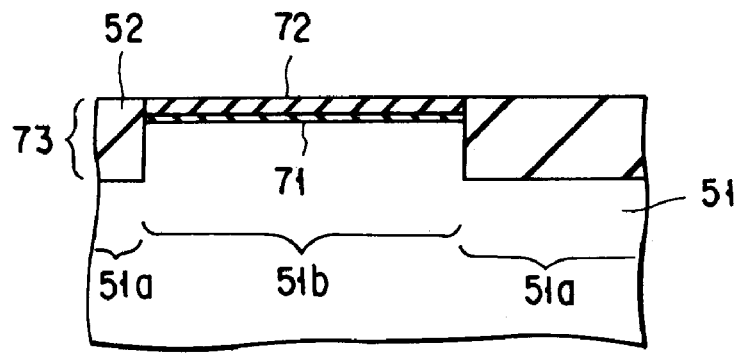
Figure 10A:
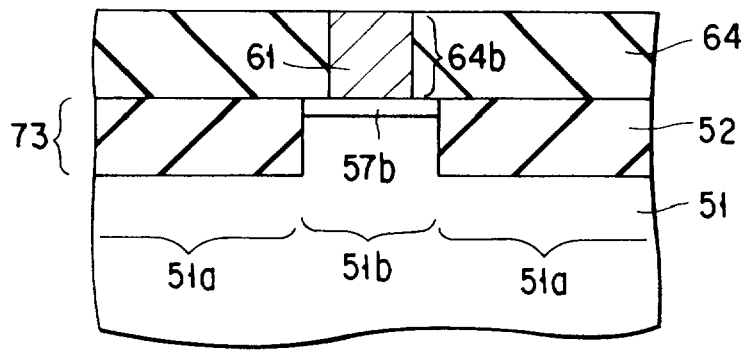
FIGS. 10A to 10C are cross-sectional view showing the major part of the DRAM of FIG. 7 in order to explain a method for manufacturing the same.
Figure 10B:
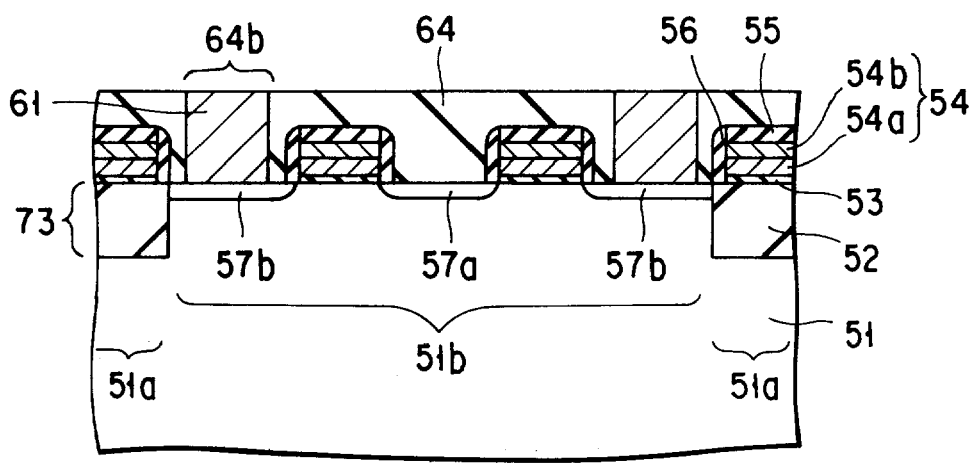
Figure 10C:
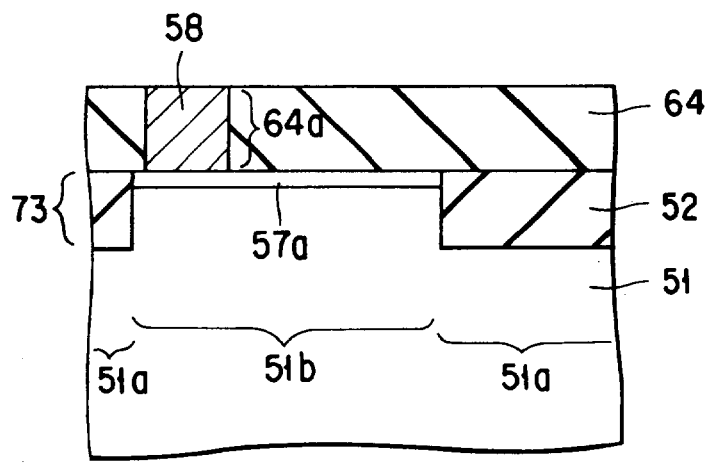
Figure 11A:
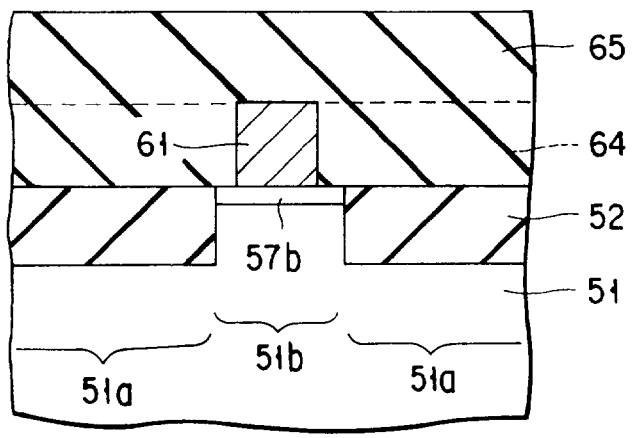
FIGS. 11A to 11C are cross-sectional view showing the major part of the DRAM of FIG. 7 in order to explain a method for manufacturing the same.
Figure 11B:
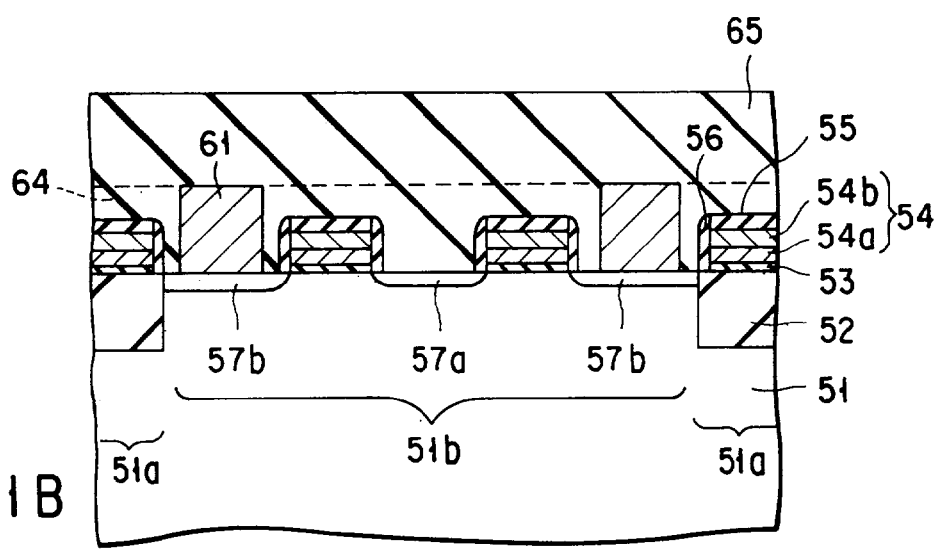
Figure 11C:
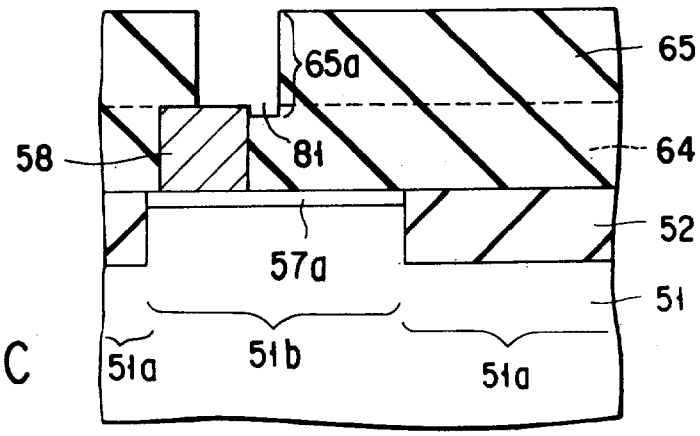
Figure 12A:
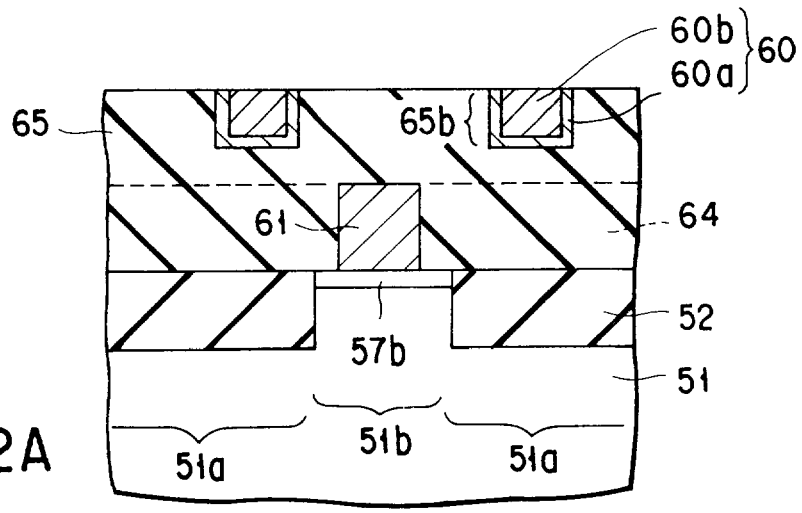
FIGS. 12A to 12C are cross-sectional view showing the major part of the DRAM of FIG. 7 in order to explain a method for manufacturing the same.
Figure 12B:
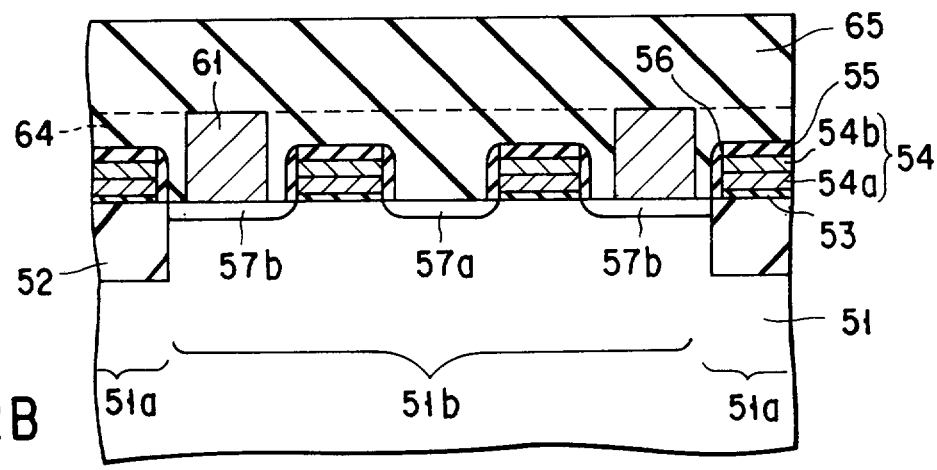
Figure 12C:
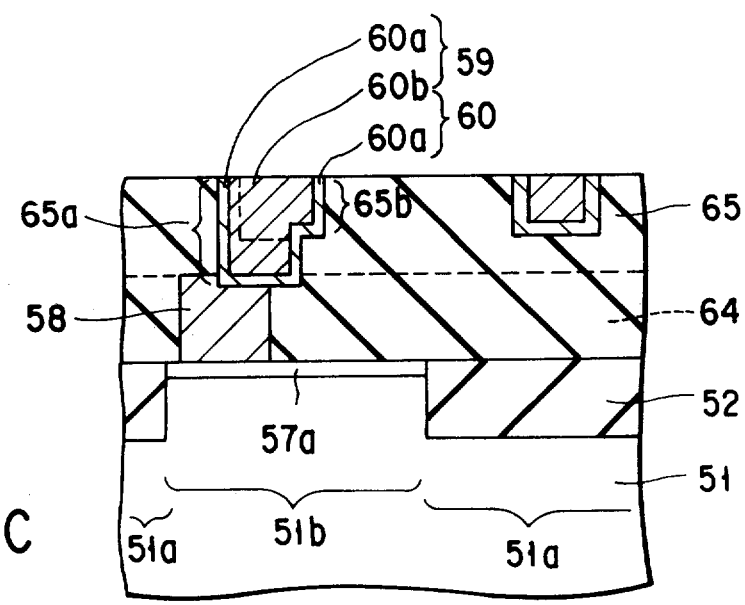
Figure 13A:
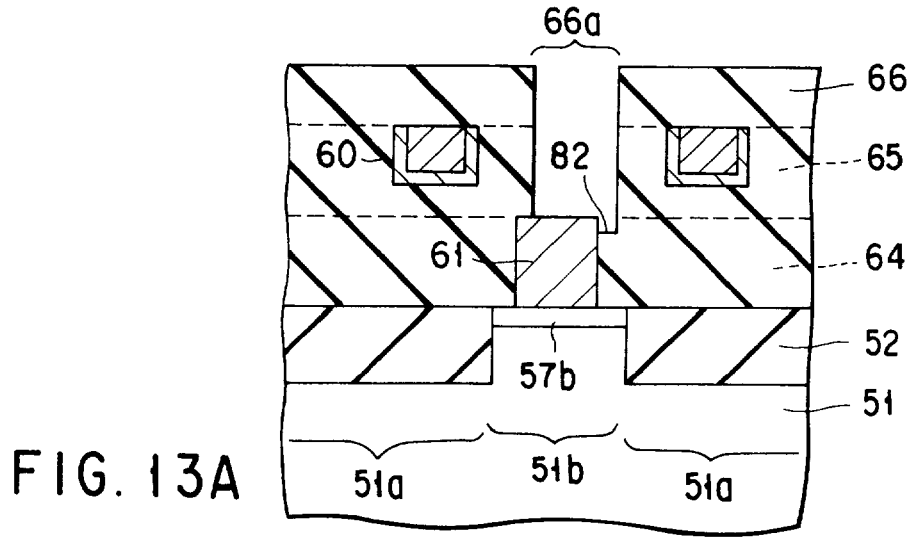
FIGS. 13A to 13C are cross-sectional view showing the major part of the DRAM of FIG. 7 in order to explain a method for manufacturing the same.
Figure 13B:
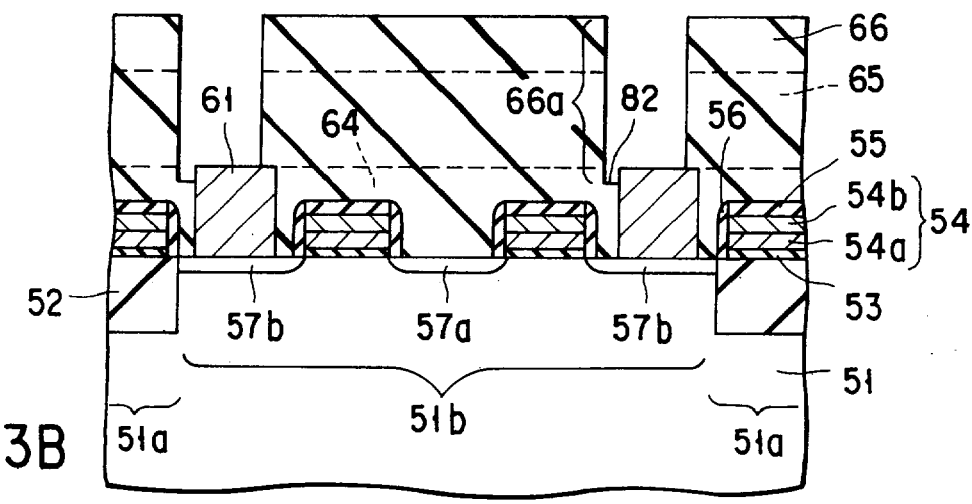
Figure 13C:
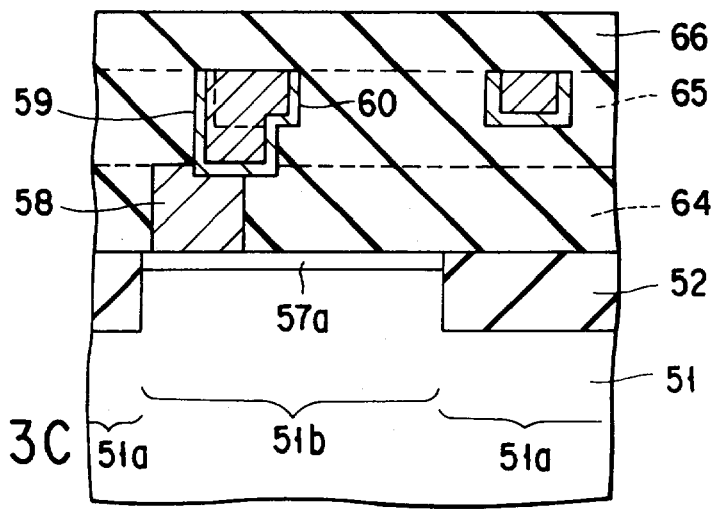

Referring to FIGS. 9A to 17C, a method for manufacturing a DRAM having the above constitution will now be described. FIGS. 9A,.10A, 11A, 12A, 13A, 14A, 15A, 16A and 17A are cross-sectional views taken along line A—A of FIG. 7, FIGS. 9B, 10B, 11B, 12B, 13B, 14B, 15B, 16B and 17B are cross-sectional views taken along line B—B of FIG. 7, and FIGS. 9C, 10C, 11C, 12C, 13C, 14C, 15C, 16C and 17C are cross-sectional views taken along line C—C of FIG. 7.

First a silicon oxide film 71 is formed on the entire surface of a p-type silicon substrate 51 by, e.g., thermal oxidation and then a silicon nitride film 72 is formed thereon by LPCVD. The films 71 and 72 are patterned by a known lithographic technique and partly removed from the silicon substrate 51 by RIE. To form an element isolation region 51a, a trench 73 is formed in a surface region of the substrate 51. A resist (not shown) for the above patterning is eliminated and a silicon oxide film is deposited on the entire surface of the resultant structure by LPCVD or plasma CVD. The silicon oxide film is flattened by CMP using the silicon nitride film 72 as an etching stopper to form an element isolation insulation film 52 only in the trench 73 (see FIGS. 9A to 9C).

The silicon nitride film 72 is separated from the structure by a heated solution of phosphoric acid, and the silicon oxide film 71 remaining on an element region 51b is etched using a solution of ammonium fluoride. At the same time, the surface of the element isolation insulation film 52 buried in the trench 73 is removed so as to be flush with the upper surface of the silicon substrate 51. After that, a gate oxide film 53 is formed on the silicon substrate 51 by thermal oxidation, phosphorus-doped polysilicon 54a is formed thereon by LPCVD, a tungsten silicide 54b is formed thereon by sputtering or CVD, and a silicon nitride film is formed thereon by LPCVD. The resultant structure is patterned by the lithographic technique and etched by RIE to form both a gate electrode 54 and an on-gate insulation film 55. After a resist (not shown) for the patterning is eliminated, arsenic or phosphorus is implanted using the gate electrode 54 as a mask to form source and drain regions, and diffusion layers 57a and 57b are formed in the surface region of the silicon substrate 51. Further, a silicon nitride film is deposited on the whole surface of the silicon substrate 51 including the gate electrode 54 and etched excluding its side-walls thereby to form a gate sidewall insulation film 56 (see FIG. 10B).

Subsequently, a first silicon oxide film 64 is deposited relatively thick on the whole surface of the silicon substrate 51 including the surface of the gate electrode 54 by, e.g., LPCVD. The upper surface of the first silicon oxide film 64 is flattened by CMP or the like, and both a contact hole 64a for forming a contact portion 58 connecting with the diffusion layer 57a and another contact hole 64b for forming a contact portion 61 connecting with the diffusion layer 57b are formed by the lithographic technique and RIE using $CHF_3$ and CO or $C_4F_8$ and CO and Ar as etching gas. Moreover, the arsenic- or phosphorus-doped polysilicon is deposited on the entire surface of the resultant structure. The arsenic- or phosphorus-doped polysilicon is removed by CMP or CDE so as to remain only in the contact holes 64a and 64b to form contact portions 58 and 61 (see FIGS. 10A to 10C).

A second silicon oxide film 65 is formed on the entire surface of the first silicon oxide film 64 including the surfaces of the contact portions 58 and 61 by LPCVD or plasma CVD. A contact hole 65a for forming a plug portion 59 connecting with the contact portion 58 is formed in the second silicon oxide film 65. Part of the contact portion 58, which protrudes from the bottom of the contact hole 65a, is removed using etching gas of $Cl_2$ or HBr to almost flatten the bottom of the contact hole 65a. It is thus possible to prevent a very small recess 81 from being formed on the bottom of the contact hole 65 due to both a shift in pattern alignment of DRAM cells in the lithographic process and an over-etching caused by considering variations in thickness and etching uniformity of the second silicon oxide film 65 when the contact hole 65a is formed by RIE (see FIG. 11C).

After that, a trench 65b for forming the bit line 60 is formed in the second silicon oxide film 65, and a barrier metal layer 60a of Ti/TiN is formed by sputtering or CVD such that its thickness covers at least the bottoms and sides of the contact hole 65a and trench 65b. The resultant structure is annealed in an atmosphere of nitrogen gas and then a metal layer 60b of tungsten or aluminum having an adequate thickness is formed on the entire surface thereof by blanket CVD or the like. The metal layers 60a and 60b are removed by CMP so as to remain only in the contact hole 65a and trench 65b to form the bit line 60 together with the plug portion 59 (see FIGS. 12A and 12C).

A third silicon oxide film 66 is formed on the entire surface of the second silicon oxide film 65 including the surfaces of the plug portion 59 and bit line 60 by LPCVD or plasma CVD. A contact hole 66a for forming a plug portion 62 connecting with the contact portion 61 is formed in the second and third silicon oxide films 65 and 66 (see FIGS. 13A and 13B).

Figure 14A:
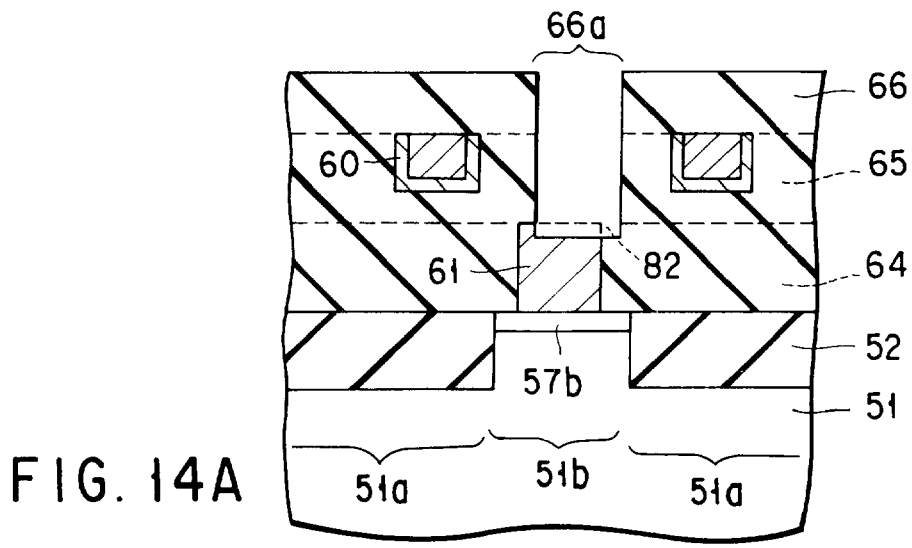
FIGS. 14A to 14C are cross-sectional view showing the major part of the DRAM of FIG. 7 in order to explain a method for manufacturing the same.
Figure 14B:
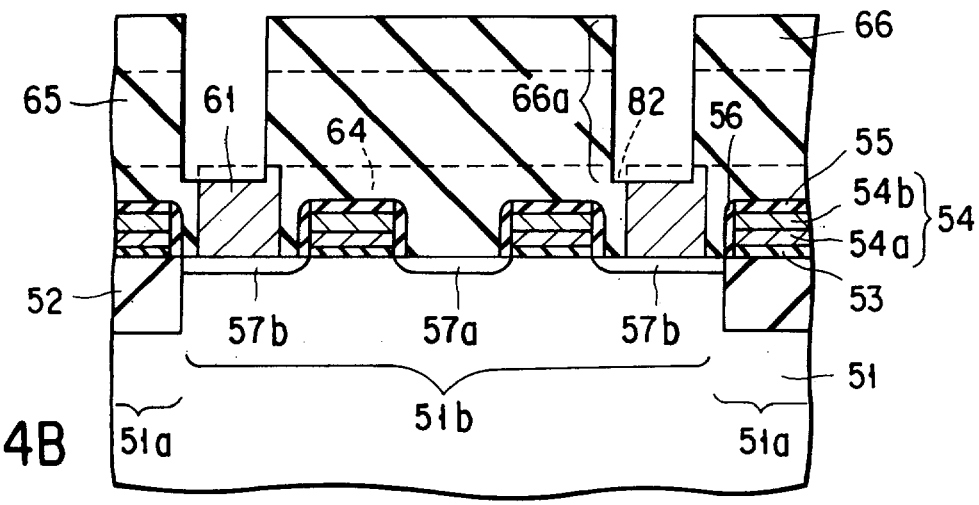
Figure 14C:
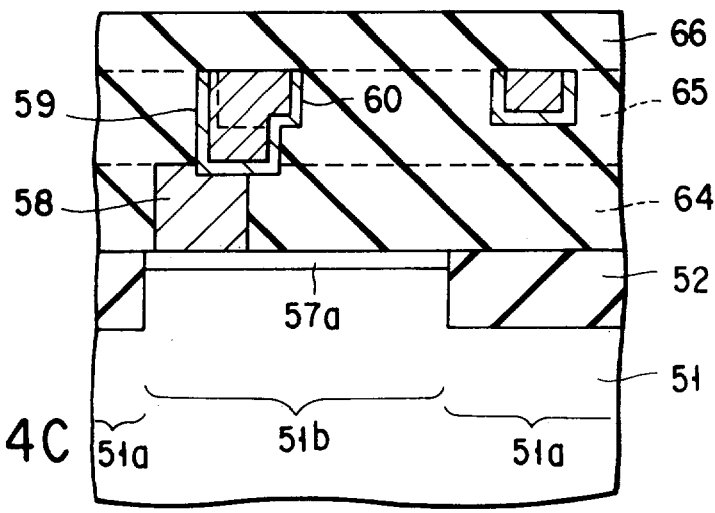
Figures 15A, 15B, 15C:
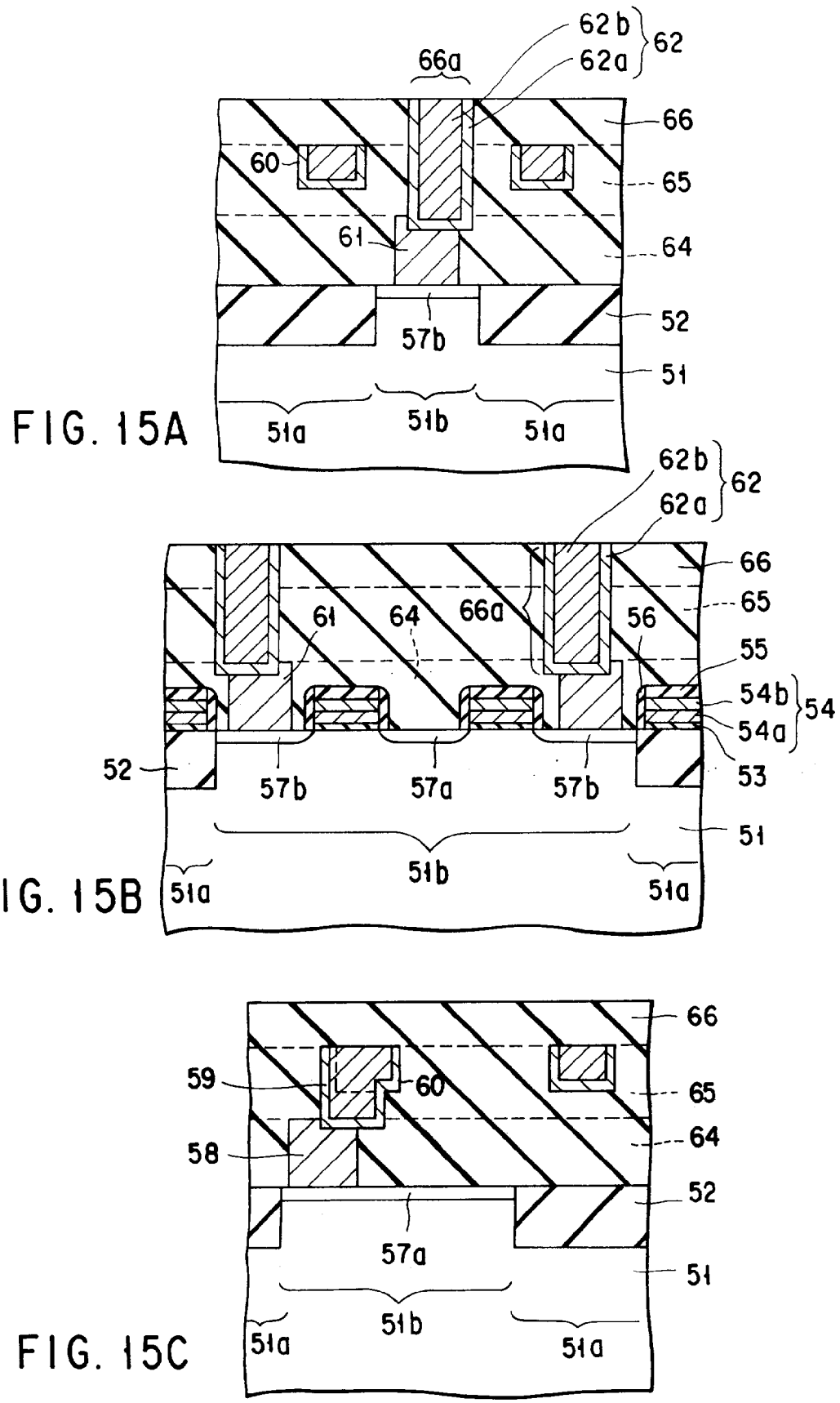
FIGS. 15A to 15C are cross-sectional view showing the major part of the DRAM of FIG. 7 in order to explain a method for manufacturing the same.
Figures 16A, 16B, 16C:
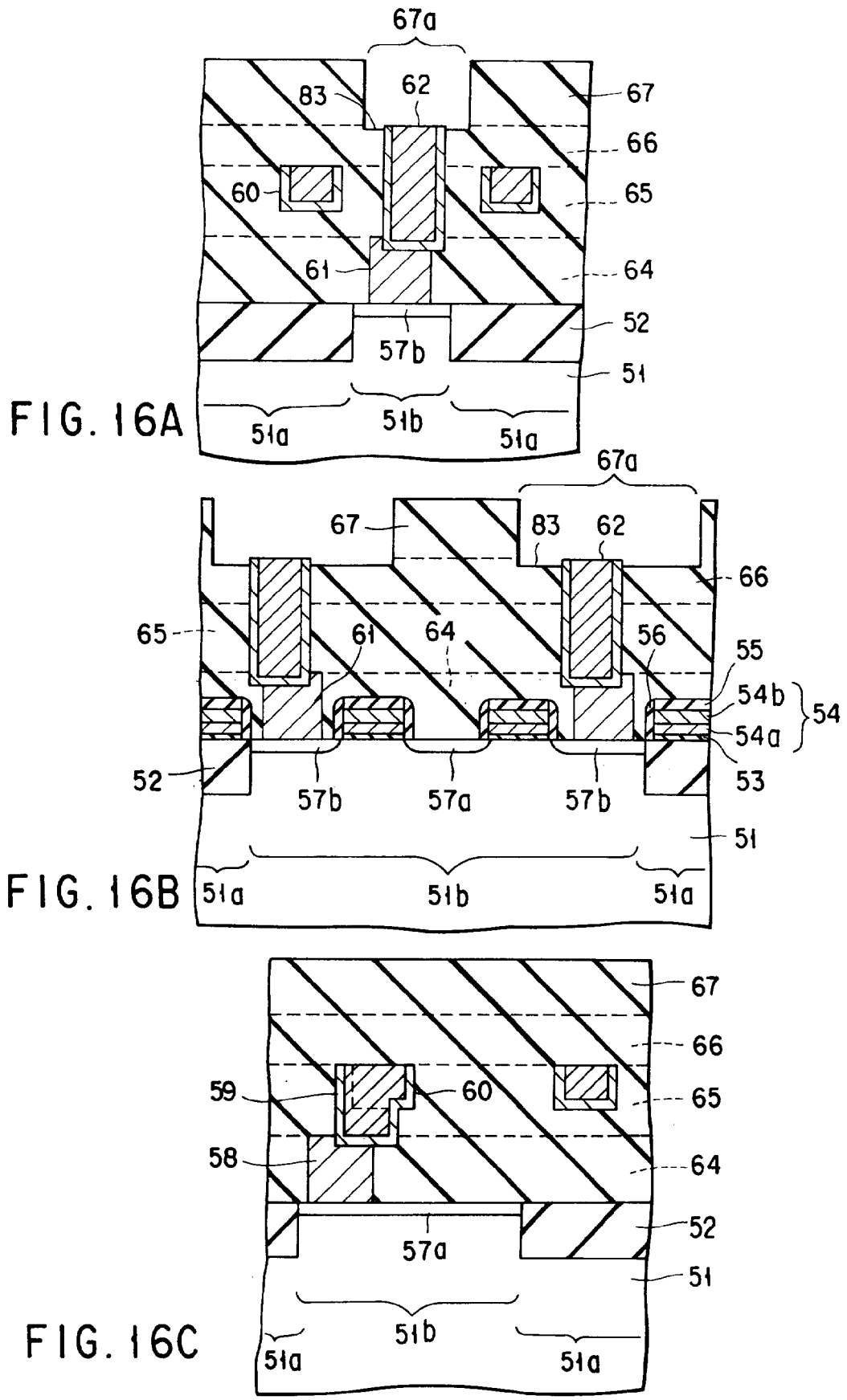
FIGS. 16A to 16C are cross-sectional view showing the major part of the DRAM of FIG. 7 in order to explain a method for manufacturing the same.

In order to prevent a very small recess 82 from being formed at the bottom of the contact hole 66a when the contact hole 66a is formed by RIE, part of the contact portion 61, which protrudes from the bottom of the contact hole 66a, is removed using etching gas of $Cl_2$ or HBr to almost flatten the bottom of the contact hole 66a (see FIGS. 14A and 14B).

After that, a barrier metal layer 62a of Ti/TiN is formed by sputtering or CVD such that its thickness sufficiently covers at least the bottom and side of the contact hole 66a. The resultant structure is annealed in an atmosphere of nitrogen gas and then a metal layer 62b of tungsten or aluminum having an adequate thickness is formed on the entire surface thereof by blanket CVD or the like. The metal layers 62a and 62b are removed by CMP so as to remain only in the contact hole 66a to form the plug portion 62 (see FIGS. 15A and 15B).

A fourth silicon oxide film 67 is formed on the entire surface of the third silicon oxide film 66 including the surface of the plug portion 62 by, e.g., LPCVD or plasma CVD. A trench 67a for forming a storage electrode 63 of the capacitor connecting with the plug portion 62 is formed in the fourth silicon oxide film 67 so as to expose all the upper surface of the plug portion 62 (see FIGS. 16A and 16B).

Figure 17A:
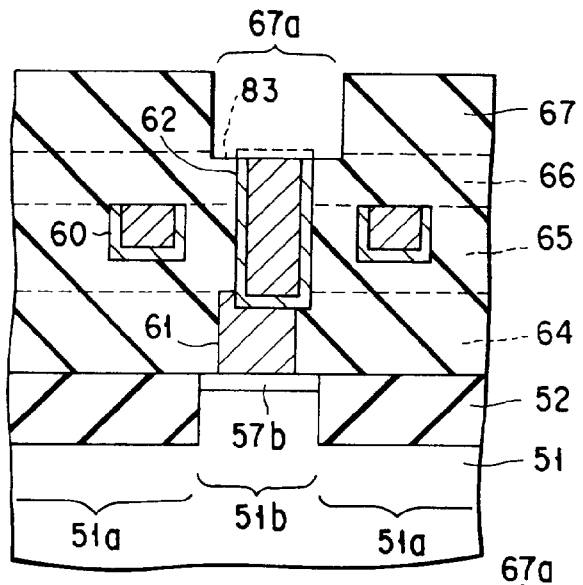
FIGS. 17A to 17C are cross-sectional view showing the major part of the DRAM of FIG. 7 in order to explain a method for manufacturing the same.
Figure 17B:
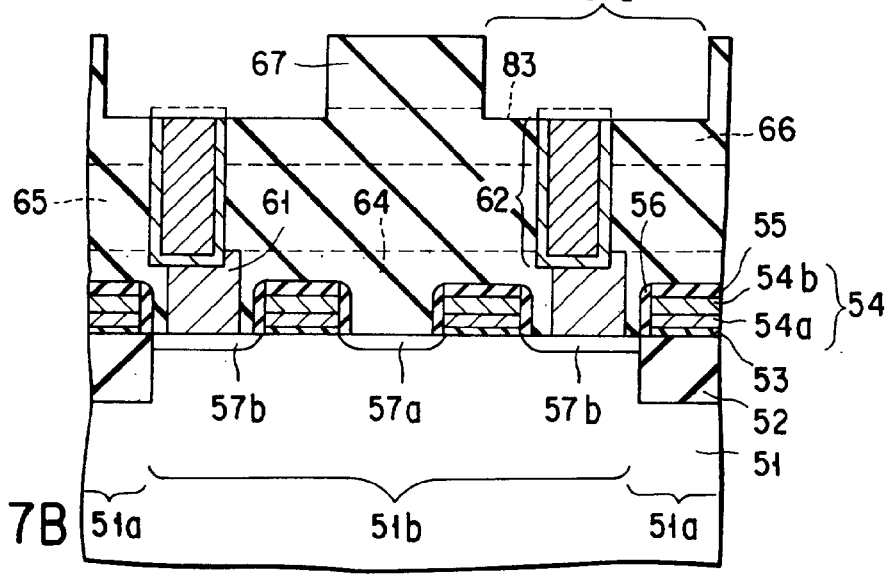
Figure 17C:
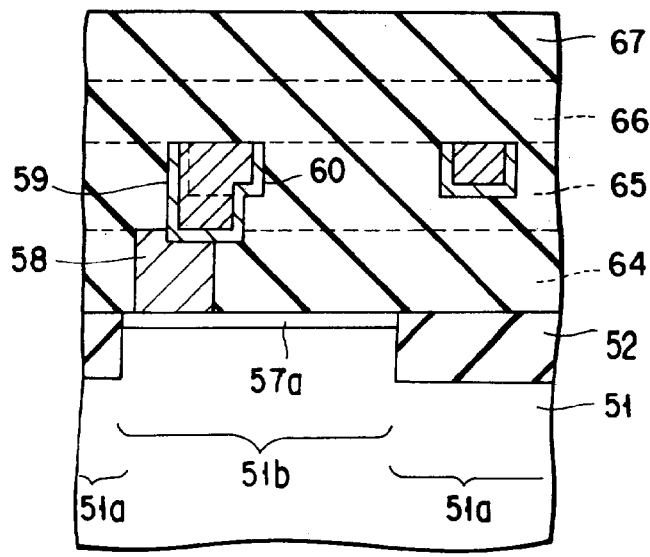

In order to prevent a very small recess 83 from being formed at the bottom of the trench 67a when the trench 67a is formed by RIE, the upper surface of the plug portion 62, which protrudes from the bottom of the trench 67a, is removed using etching gas of $SF_6$ and $Cl_2$ to almost flatten the bottom of the trench 67a (see FIGS. 17A and 17B).

An Ru film having a desired thickness is formed at least on the bottom and side of the trench 67a and then removed by CMP so as to remain only in the trench 67a, thereby to form the above storage electrode 63. Furthermore, a BSTO film is deposited on the entire surface of the fourth silicon oxide film 67 including the surface of the storage electrode 63 by sputtering or CVD such that it has a desired thickness on the bottom and side of the trench 67a, thereby forming a capacitor insulation film 69. If an Ru film having a desired thickness is deposited through the capacitor insulation film 69 to form a plate electrode 70, a DRAM having the cell structure as shown in FIGS. 7 and 8A to 8C can be obtained.

According to the DRAM as shown in FIGS. 7 and 8A to 8C, a very small recess 83 can be prevented from being formed in the contact portion between the plug portion 62 and storage electrode 63 when the trench 67a connecting with the plug portion 62 is formed. It is thus possible to sufficiently cover the capacitor insulation film 69 and plate electrode 70 when the storage electrode 63 is formed in the trench 67a. Consequently, the lower plug portion 62 and upper storage electrode 63 can be brought into reliable contact with each other, thus preventing a decrease in reliability due to poor contact such as an increase in contact resistance and disconnection. In this DRAM, too, the same advantage can be expected with respect to the contact between the lower contact portion 58 and upper plug portion 59 and between the lower contact portion 61 and upper plug portion 62.

Figure 18:
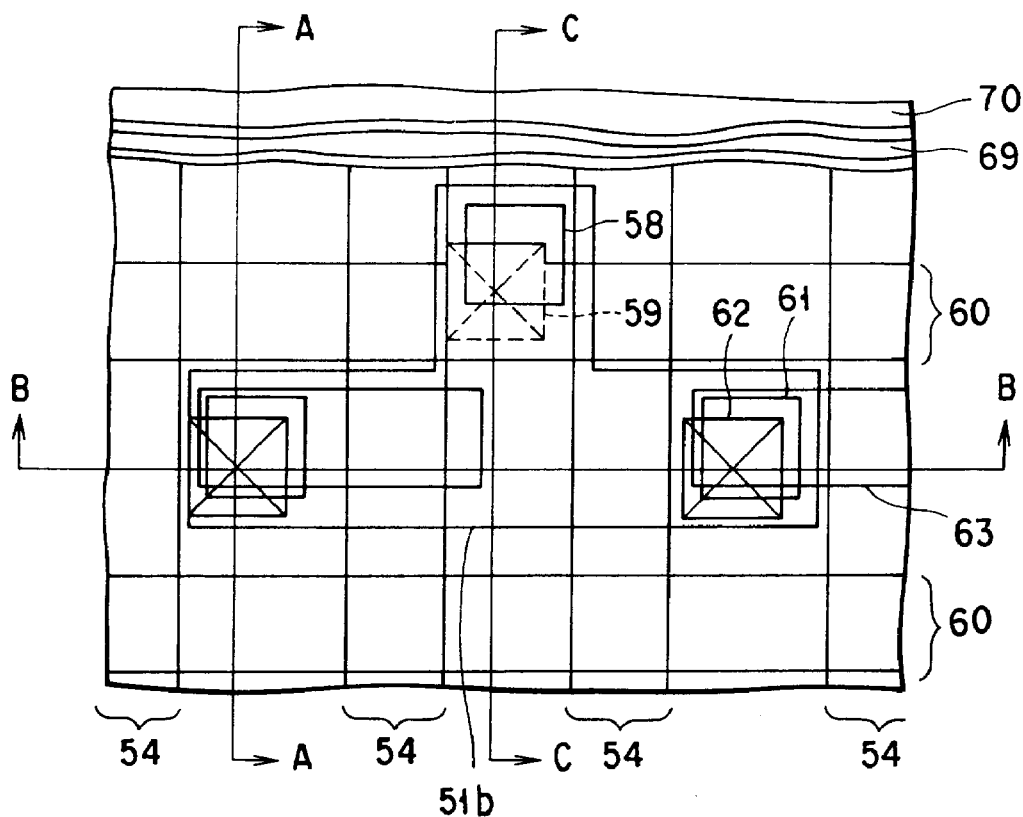
FIG. 18 is a plan view illustrating an example of the semiconductor device of FIG. 7 in which the short side of a storage electrode is almost equal to the width of a plug portion.
Figure 19A:
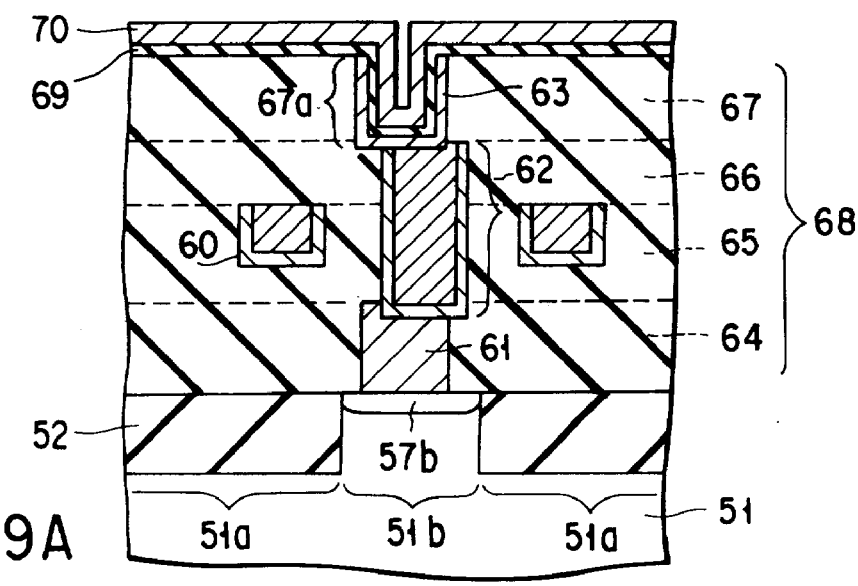
FIGS. 19A to 19C are cross-sectional views illustrating an example of the semiconductor device of FIG. 18 in which the short side of a storage electrode is almost equal to the width of a plug portion.
Figure 19B:
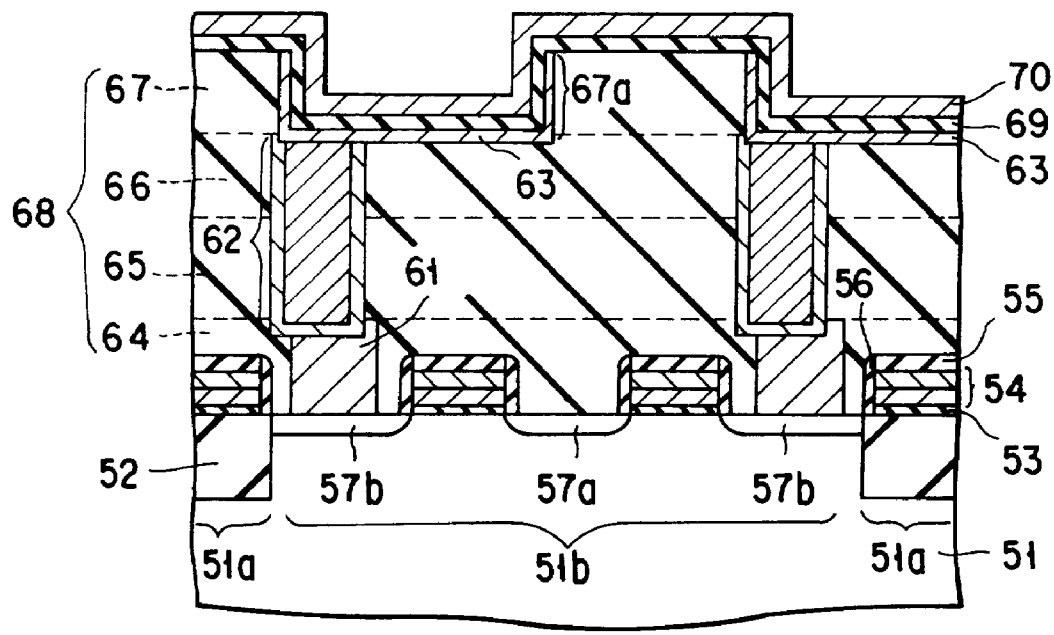
Figure 19C:
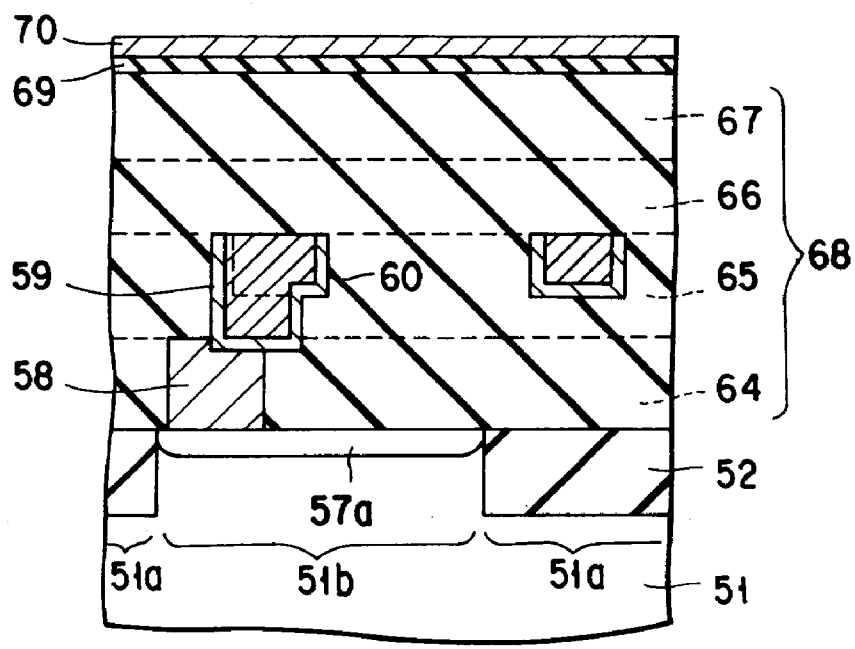

FIGS. 18 and 19A to 19C illustrate an example of the DRAM of the second embodiment in which the short side of the storage electrode 63 is almost equal to the width of the plug portion 62. FIG. 18 is a plan view of the major part of the cell structure of the DRAM, FIG. 19A is a cross-sectional view taken along line A—A of FIG. 18, FIG. 19B is a cross-sectional view taken along line B—B of FIG. 18, and FIG. 19C is a cross-sectional view taken along line C—C of FIG. 18.

In the DRAM illustrated in FIGS. 18 and 19A to 19C, it is difficult to form a trench 67a so as to completely expose the upper surface of the plug portion 62 even if the pattern alignment of DRAM cells is slightly shifted in the lithographic process. It is thus more likely that a very small recess 83 will be formed in the contact portion between the plug portion 62 and storage electrode 63. If, therefore, a difference between the bottom of the trench 67a and the plug portion 62 projecting therefrom is eliminated, the lower plug portion 62 and upper storage electrode 63 can be put into reliable contact with each other.

Figure 20A:
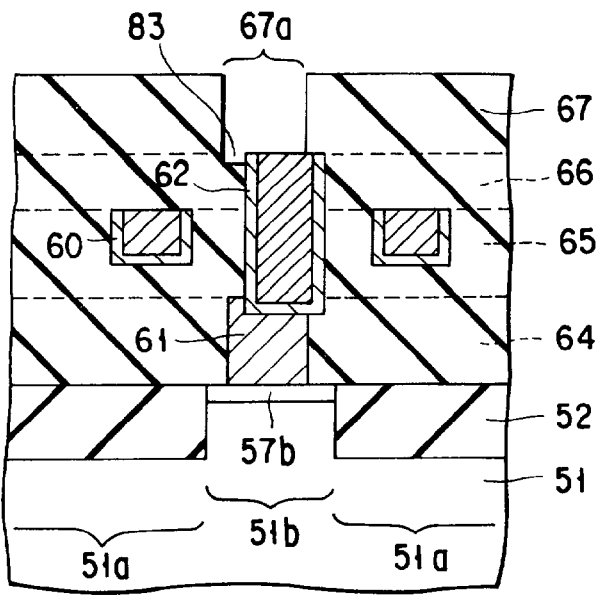
FIGS. 20A to 20C are cross-sectional views showing the major part of the method for manufacturing the DRAM of FIG. 18.
Figure 20B:
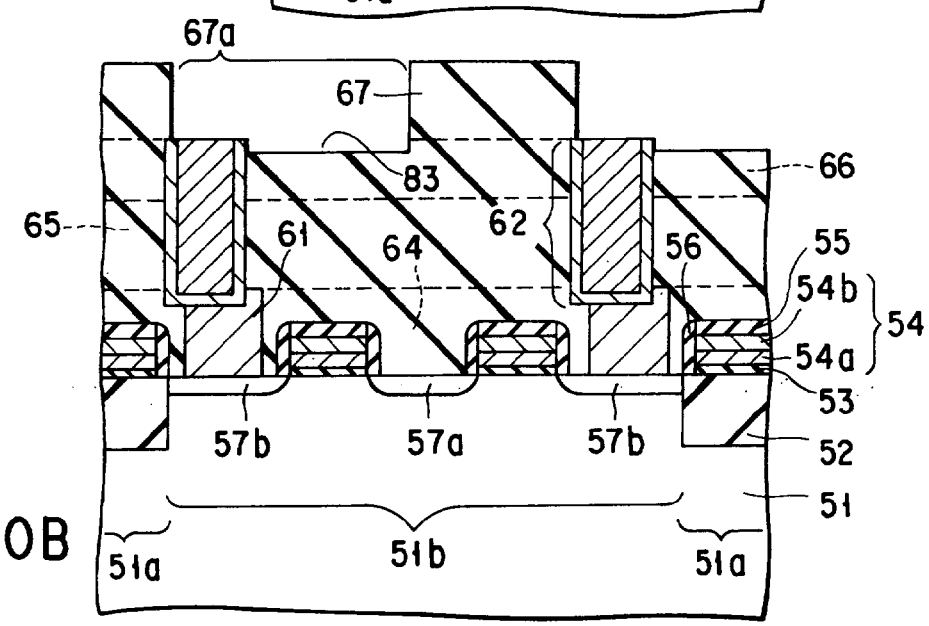
Figure 20C:
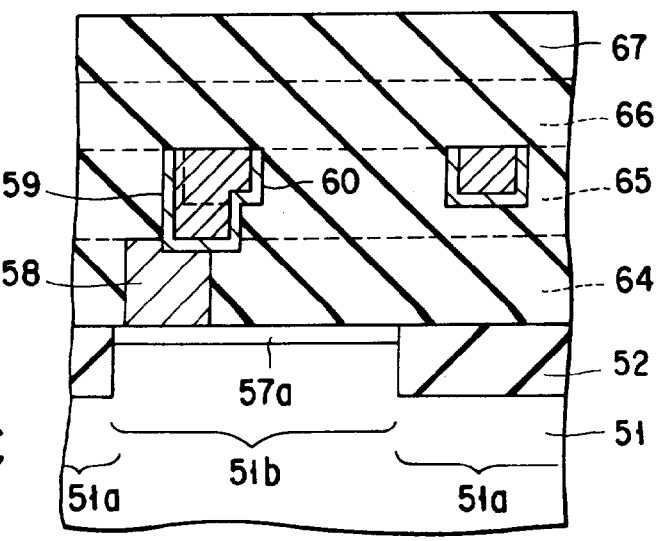

After the process of forming the plug portion 62 connecting with the contact portion 61 (FIGS. 9A to 15C), a fourth silicon oxide film 67 is formed on the entire surface of the third silicon oxide film 66 including the surface of the plug portion 62 by, e.g., LPCVD or plasma CVD, as illustrated in FIGS. 20A to 20C. Similarly, in order to form a storage electrode 63 of the capacitor, a trench 67a connecting with the plug portion 62 is formed such that the short side of the storage electrode 63 is almost equal to the width of the plug portion 62 (see FIGS. 20A and 20B).

Figure 21A:
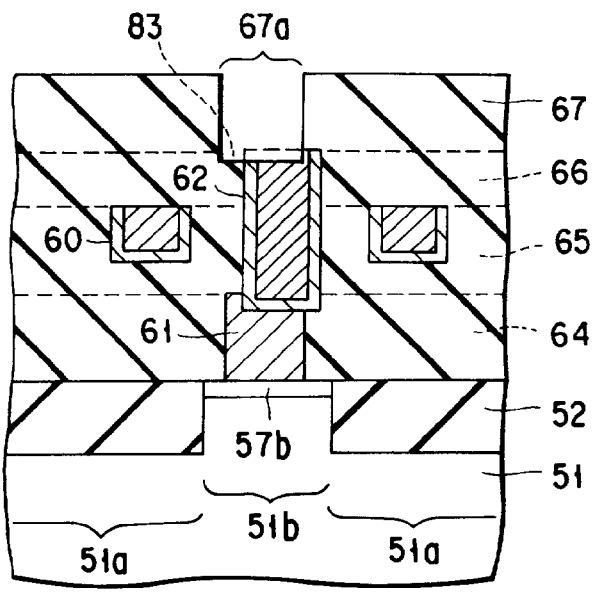
FIGS. 21A to 21C are cross-sectional views showing the major part of the method for manufacturing the DRAM of FIG. 18.
Figure 21B:
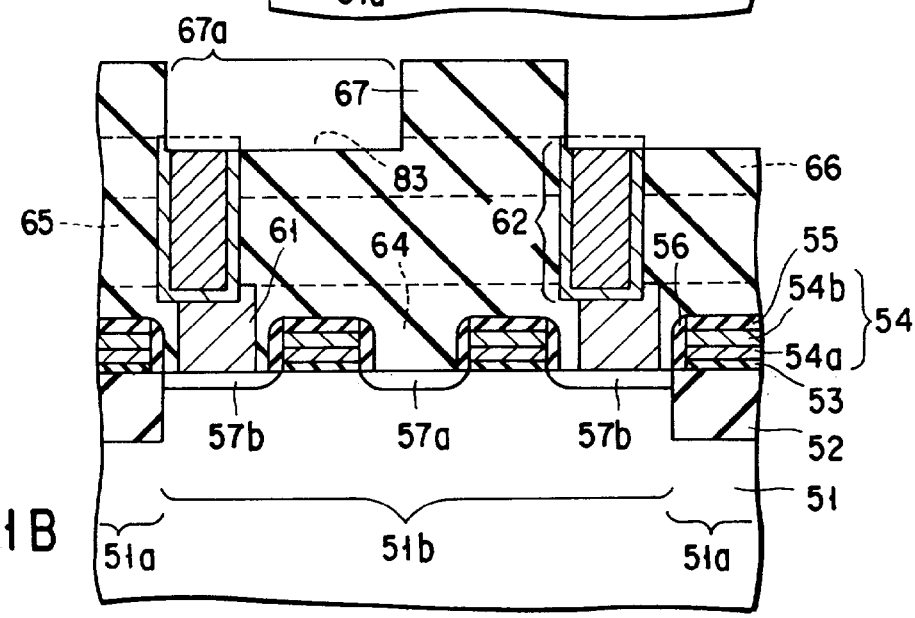
Figure 21C:
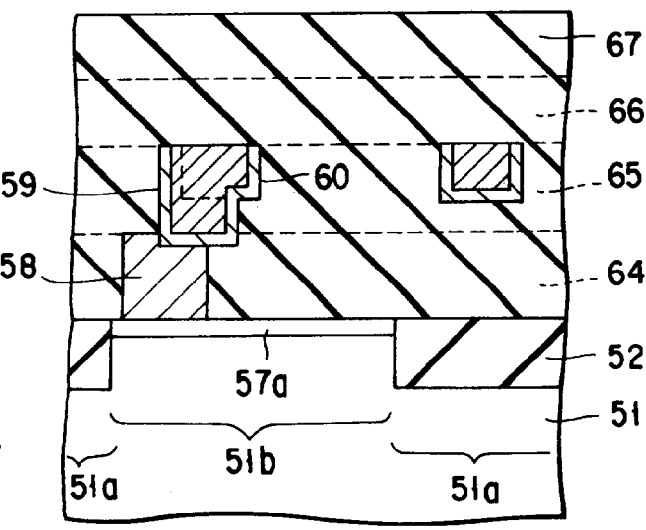

To prevent a very small recess 83 from being formed at the bottom of the trench 67a when the trench 67a is formed by RIE, the upper surface of the plug portion 62, which protrudes from the bottom of the trench 67a, is removed using etching gas of $SF_6$ and $Cl_2$ to almost flatten the bottom of the trench 67a (see FIGS. 21A and 21B).

After that, the storage electrode 63, capacitor insulation film 69 and plate electrode 70 are formed in the same manner to obtain a DRAM having the cell structure as shown in FIGS. 18 and 19A to 19C. In this DRAM, too, the very small recess 83 can be prevented from being formed in the contact portion between the plug portion 62 and storage electrode 63. It is thus possible to sufficiently cover the capacitor insulation film 69 and plate electrode 70 when the storage electrode 63 is formed in the trench 67a. Consequently, the lower plug portion 62 and upper storage electrode 63 can be brought into reliable contact with each other, thus preventing a decrease in reliability due to poor contact such as an increase in contact resistance and disconnection.

In the DRAM of the second embodiment as described above, the bottoms of the contact holes 65a and 66a and the trench 67a need not be completely flattened, but can be done properly to such an extent that the conductive film can be formed sufficiently.

The storage electrode 63 can be formed by forming a sacrifice oxide film so as to fill the trench 67a, then etching the Ru film by RIE, and separating the sacrifice oxide film.

When the trench 67a is forward-tapered at an angle of 60° to 88°, the storage electrode 63 can be formed by simple sputtering.

As materials for the storage electrode 63 and plate electrode 70, not only Ru but also at least one of Pt, Re, Os, Rh, Ir, Sr, W, Nb, Al, Ti, Ta, Mo, Cu, Pb, an oxide of each of Ru, Pt, Re, Os, Rh, Ir and Sr, an alloy of some of Ru, Pt, Re, Os, Rh, Ir and Sr, an oxide of the alloy, and a nitride of each of W, Nb, Al, Ti and Ta can be employed.

More over, for example, any one of $BaTiO_3$, $SrTiO_3$, $PbZrO_3$, $LiNbO_3$, $Bi_4Ti_3O_{12}$ and $Ta_2O_5$ as well as BSTO can be used as the capacitor insulation film 69.

It is needless to say that various changes and modifications can be made without departing from the scope of the subject matter of the present invention.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising:

a first step of forming a first conductive layer on a first insulation film;

a second step of forming a second insulation film on an surface of the first insulation film including a surface of the first conductive layer;

a third step of selectively removing the second insulation film corresponding to at least part of the first conductive layer to form a trench portion more deeply than the first conductive layer;

a fourth step of removing part of the first conductive layer which is exposed from the a bottom of the trench portion; and a fifth step of forming a second conductive layer, which connects with the first conductive layer, in the trench portion.

2. The method according to claim 1, wherein the fourth step is a step of selectively removing the first conductive layer so as to flatten the bottom of the trench portion.

3. A method for manufacturing a semiconductor memory device, comprising:
   a first step of forming an MOS transistor for transferring information;
   a second step of forming a bit line electrically connected to one of source and drain regions of the MOS transistor;
   a third step of forming a plug electrode electrically connected to other of the source and drain regions of the MOS transistor;
   a fourth step of forming an interlayer insulation film on an upper surface of the MOS transistor including an upper surface of the plug electrode;
   a fifth step of selectively removing the interlayer insulation film corresponding to at least part of the plug electrode to form a trench portion more deeply than the plug electrode;
   a sixth step of removing part of the plug electrode which is exposed from a bottom of the trench portion;
   a seventh step of forming a storage electrode, which electrically connects with the plug electrode, in the trench portion;
   an eighth step of forming a capacitor insulation film on an upper surface of the interlayer insulation film including an upper surface of the storage electrode; and
   a ninth step of forming a plate electrode on the capacitor insulation film.

4. The method according to claim 3, wherein the sixth step is a step of selectively removing the plug electrode so as to flatten the bottom of the trench portion.

5. A method for manufacturing a semiconductor memory device, comprising:
   a first step of forming an MOS transistor for transferring information
   a second step of forming a first interlayer insulation film so as to cover the MOS transistor;
   a third step of forming a first contact portion on the first interlayer insulation film by selectively opening a hole in the first interlayer insulation film and filling the hole with a conductive material so that the first contact portion is electrically connected with one of source and drain regions of the transistor;
   a fourth step of forming a second contact portion on the first interlayer insulation film by selectively opening a hole in the first interlayer insulation film and filling the hole with a conductive material so that the second contact portion is electrically connected with other of the source and drain regions of the transistor;
   a fifth step of forming a second interlayer insulation film on an upper surface of the first interlayer insulation film including upper surfaces of the first and second contact portions;
   a sixth step of selectively removing the second interlayer insulation film corresponding to at least part of the first contact portion to form a first trench portion more deeply than the first contact portion;
   a seventh step of removing part of the first contact portion which is exposed from a bottom of the first trench portion;
   an eighth step of forming a bit line, which electrically connects with the first contact portion, in the first trench portion;
   a ninth step of forming a third interlayer insulation film on an upper surface of the second interlayer insulation film including an upper surface of the bit line;
   a tenth step of selectively removing the second interlayer insulation film and the third interlayer insulation film corresponding to at least part of the second contact portion to form a second trench portion more deeply than the second contact portion;
   an eleventh step of removing part of the second contact portion which is exposed from a bottom of the second trench portion;
   a twelfth step of forming a plug electrode, which electrically connects with the second contact portion, in the second trench portion;
   a thirteenth step of forming a fourth interlayer insulation film on an upper surface of the third interlayer insulation film including an upper surface of the plug electrode;
   a fourteenth step of selectively removing the fourth interlayer insulation film corresponding to at least part of the plug electrode to form a third trench portion more deeply than the plug electrode;
   a fifteenth step of removing part of the plug electrode which is exposed from a bottom of the third trench portion;
   a sixteenth step of forming a storage electrode, which is electrically connected to the plug electrode, in the third trench portion;
   a seventeenth step of forming a capacitor insulation film on an upper surface of the fourth interlayer insulation film including an upper surface of the storage electrode; and
   an eighteenth step of forming a plate electro de on the capacitor insulation film.

6. The method according to claim 5, wherein the seventh step, the eleventh step and the fifteenth step are executed to flatten the bottoms of the first, second and third trench portions.

* * * * *

UNITED STATES PATENT AND TRADEMARK OFFICE
CERTIFICATE OF CORRECTION

PATENT NO.: 6153,510
DATED: November 28, 2000
INVENTOR: Yutaka ISHIBASHI

It is certified that errors appear in the above-identified patent and that said Letters Patent is hereby corrected as shown below:

On the cover page, under the Inventor [75]:

"Kawasaski" has been replaced with --Kawasaki--.

On the cover page, under Abstract [56], line 4:

"connect g" has been replaced with --connecting--.

In Claim 23, column 16, line 49:
"electro d" has been replaced with --electrode--.

Signed and Sealed this

Twenty-ninth Day of May, 2001

*Attest:*

NICHOLAS P. GODICI

*Attesting Officer*    *Acting Director of the United States Patent and Trademark Office*